(12) United States Patent  (10) Patent No.: US 7,441,209 B2
Roesner et al.  (45) Date of Patent: Oct. 21, 2008

(54) METHOD, SYSTEM AND PROGRAM PRODUCT FOR PROVIDING A CONFIGURATION SPECIFICATION LANGUAGE SUPPORTING ERROR CHECKING DIALS

(75) Inventors: Wolfgang Roesner, Austin, TX (US); Robert J. Shadowen, Austin, TX (US); Derek E. Williams, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 418 days.

(21) Appl. No.: 11/245,300

(22) Filed: Oct. 6, 2005

(65) Prior Publication Data

US 2007/0083843 A1  Apr. 12, 2007

(51) Int. Cl.
*G06F 17/50* (2006.01)
(52) U.S. Cl. .................................. 716/1; 716/3; 716/18
(58) Field of Classification Search ...................... 716/1, 716/3–5, 18
See application file for complete search history.

(56) References Cited

U.S. PATENT DOCUMENTS

| 6,581,191 | B1 | 6/2003 | Schubert et al. |
| 6,618,839 | B1 | 9/2003 | Beardslee et al. |
| 2004/0117744 | A1* | 6/2004 | Nation et al. ................... 716/1 |
| 2004/0216076 | A1* | 10/2004 | Hunt et al. ..................... 716/18 |

* cited by examiner

*Primary Examiner*—Paul Dinh
(74) *Attorney, Agent, or Firm*—Dillon & Yudell LLP

(57) ABSTRACT

A digital system includes one or more design entities containing a functional portion of the digital system. Within a configuration database, one or more configuration entities are instantiated. The configuration entities including an Error checking Dial (EDial) having a plurality of input latches within the digital design and a plurality of output latches within the digital design. The EDial has an associated function defining a relationship between values of the input latches and values of the output latches. An instance of the EDial in the configuration database is accessed to access the values of the output latches in the digital design.

20 Claims, 15 Drawing Sheets

METHOD, SYSTEM AND PROGRAM PRODUCT FOR PROVIDING A CONFIGURATION SPECIFICATION LANGUAGE SUPPORTING ERROR CHECKING DIALS

CROSS-REFERENCE TO RELATED APPLICATION

The present application is related to U.S. patent application Ser. No. 10/902,595, which is assigned to the assignee of the present invention and incorporated herein by reference in its entirety.

BACKGROUND OF THE INVENTION

1. Technical Field

The present invention relates in general to designing, simulating and configuring digital devices, modules and systems, and in particular, to methods and systems for computer-aided design, simulation, and configuration of digital devices, modules and systems described by a hardware description language (HDL) model.

2. Description of the Related Art

In a typical digital design process, verifying the logical correctness of a digital design and debugging the design (if necessary) are important steps of the design process performed prior to developing a circuit layout. Although it is certainly possible to test a digital design by actually building the digital design, digital designs, particularly those implemented by integrated circuitry, are typically verified and debugged by simulating the digital design on a computer, due in part to the time and expense required for integrated circuit fabrication.

In a typical automated design process, a circuit designer enters into an electronic computer-aided design (ECAD) system a high-level description of the digital design to be simulated utilizing a hardware description language (HDL), such as VHDL, thus producing a digital representation of the various circuit blocks and their interconnections. In the digital representation, the overall circuit design is frequently divided into smaller parts, hereinafter referred to as design entities, which are individually designed, often by different designers, and then combined in a hierarchical manner to create an overall model. This hierarchical design technique is very useful in managing the enormous complexity of the overall design and facilitates error detection during simulation.

The ECAD system compiles the digital representation of the design into a simulation model having a format best suited for simulation. A simulator then exercises the simulation model to detect logical errors in the digital design.

A simulator is typically a software tool that operates on the simulation model by applying a list of input stimuli representing inputs of the digital system. The simulator generates a numerical representation of the response of the circuit to the input stimuli, which response may then either be viewed on the display screen as a list of values or further interpreted, often by a separate software program, and presented on the display screen in graphical form. The simulator may be run either on a general-purpose computer or on another piece of electronic apparatus specially designed for simulation. Simulators that run entirely in software on a general-purpose computer are referred to as "software simulators," and simulators that run with the assistance of specially designed electronic apparatus are referred to as "hardware simulators."

As digital designs have become increasingly complex, digital designs are commonly simulated at several levels of abstraction, for example, at functional, logical and circuit levels. At the functional level, system operation is described in terms of a sequence of transactions between registers, adders, memories and other functional units. Simulation at the functional level is utilized to verify the high-level design of digital systems. At the logical level, a digital system is described in terms of logic elements such as logic gates and flip-flops. Simulation at the logical level is utilized to verify the correctness of the logic design. At the circuit level, each logic gate is described in terms of its circuit components such as transistors, impedances, capacitances, and other such devices. Simulation at the circuit level provides detailed information about voltage levels and switching speeds.

In order to verify the results of any given simulation run, custom-developed programs written in high-level languages such as C or C++, referred to as a reference model, are written to process input stimuli (also referred to as test vectors) to produce expected results of the simulation run. The test vector is then run against the simulation execution model by the simulator. The results of the simulation run are then compared to the results predicted by the reference model to detect discrepancies, which are flagged as errors. Such a simulation check is known in the verification art as an "end-to-end" check.

In modern data processing systems, especially large server-class computer systems, the number of latches that must be loaded to configure the system for operation (or simulation) is increasing dramatically. Conventionally, configuration latches and their permitted range of values have been specified by error-prone paper documentation that is tedious to create and maintain. Compounding the difficulty in maintaining accurate configuration documentation and the effort required to set configuration latches is the fact that different constituencies within a single company (e.g., a functional simulation team, a laboratory debug team, and one or more customer firmware teams) often separately develop configuration software from the configuration documentation. As the configuration software is separately developed by each constituency, each team may introduce its own errors and employ its own terminology and naming conventions. Consequently, the configuration software developed by the different teams is not compatible and cannot easily be shared between the different teams.

SUMMARY OF THE INVENTION

Improved methods, systems, and program products for specifying the configuration of a digital system, such as an integrated circuit or collection of interconnected integrated circuits, are disclosed. The digital system includes one or more design entities containing a functional portion of the digital system. According to one method, within a configuration database, one or more configuration entities are instantiated. The configuration entities including an Error checking Dial (EDial) having a plurality of input latches within the digital design and a plurality of output latches within the digital design. The EDial has an associated function defining a relationship between values of the input latches and values of the output latches. An instance of the EDial in the configuration database is accessed to access the values of the output latches in the digital design.

All objects, features, and advantages of the present invention will become apparent in the following detailed written description.

BRIEF DESCRIPTION OF THE DRAWINGS

The novel features believed characteristic of the invention are set forth in the appended claims. However, the invention, as well as a preferred mode of use, will best be understood by reference to the following detailed description of an illustrative embodiment when read in conjunction with the accompanying drawings, wherein:

DETAILED DESCRIPTION OF ILLUSTRATIVE EMBODIMENT

The present invention employs a configuration specification language and associated methods, systems, and program products for configuring and controlling the setup of a digital system (e.g., one or more integrated circuits or a simulation model thereof). In at least one embodiment, configuration specifications for signals in the digital system are created in HDL code by the designer responsible for an associated design entity. Thus, designers at the front end of the design process, who are best able to specify the signal names and associated legal values, are responsible for creating the configuration specification. The configuration specification is compiled at model build time together with the HDL describing the digital system to obtain a configuration database that can then be utilized by downstream organizational groups involved in the design, simulation, and hardware implementation processes.

Figure 1:
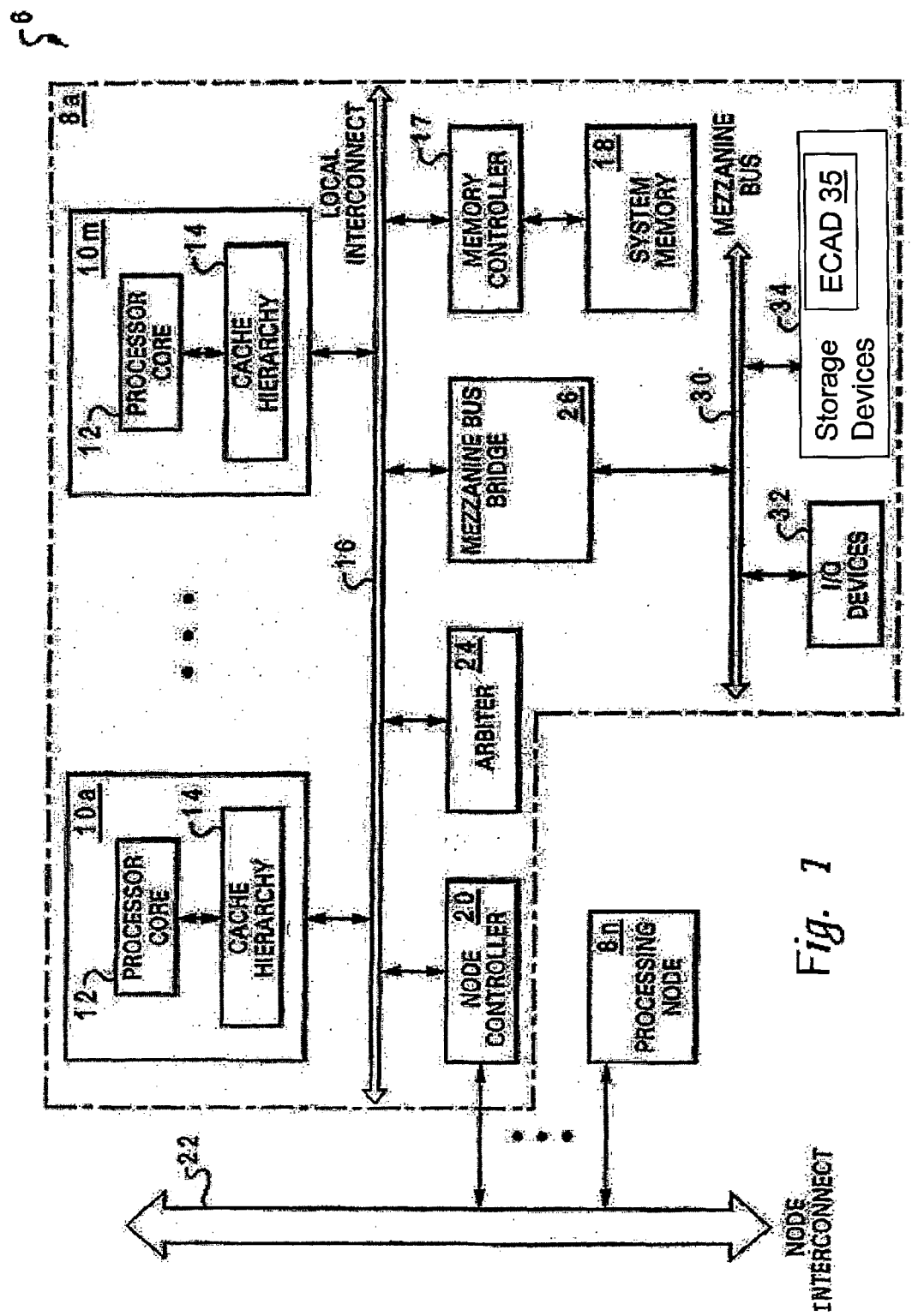
FIG. 1 is a high level block diagram of a data processing system that may be utilized to implement the present invention.

With reference now to the figures, and in particular with reference to FIG. 1, there is depicted an exemplary embodiment of a data processing system in accordance with the present invention. The depicted embodiment can be realized, for example, as a workstation, server, or mainframe computer.

As illustrated, data processing system 6 includes one or more processing nodes 8a-8n, which, if more than one processing node 8 is implemented, are interconnected by node interconnect 22. Processing nodes 8a-8n may each include one or more processors 10, a local interconnect 16, and a system memory 18 that is accessed via a memory controller 17. Processors 10a-10m are preferably (but not necessarily) identical and may comprise a processor within the PowerPC™ line of processors available from International Business Machines (IBM) Corporation of Armonk, N.Y. In addition to the registers, instruction flow logic and execution units utilized to execute program instructions, which are generally designated as processor core 12, each of processors 10a-10m also includes an on-chip cache hierarchy that is utilized to stage data to the associated processor core 12 from system memories 18.

Each of processing nodes 8a-8n further includes a respective node controller 20 coupled between local interconnect 16 and node interconnect 22. Each node controller 20 serves as a local agent for remote processing nodes 8 by performing at least two functions. First, each node controller 20 snoops the associated local interconnect 16 and facilitates the transmission of local communication transactions to remote processing nodes 8. Second, each node controller 20 snoops communication transactions on node interconnect 22 and masters relevant communication transactions on the associated local interconnect 16. Communication on each local interconnect 16 is controlled by an arbiter 24. Arbiters 24 regulate access to local interconnects 16 based on bus request signals generated by processors 10 and compile coherency responses for snooped communication transactions on local interconnects 16.

Local interconnect 16 is coupled, via mezzanine bus bridge 26, to a mezzanine bus 30. Mezzanine bus bridge 26 provides both a low latency path through which processors 10 may directly access devices among I/O devices 32 and storage devices 34 that are mapped to bus memory and/or I/O address spaces and a high bandwidth path through which I/O devices 32 and storage devices 34 may access system memory 18. I/O devices 32 may include, for example, a display device, a keyboard, a graphical pointer, and serial and parallel ports for connection to external networks or attached devices. Storage devices 34 may include, for example, optical or magnetic disks that provide non-volatile storage for operating system, middleware and application software. In the present embodiment, such application software includes an ECAD system 35, which can be utilized to develop, verify and simulate a digital circuit design in accordance with the methods and systems of the present invention.

Figure 2:
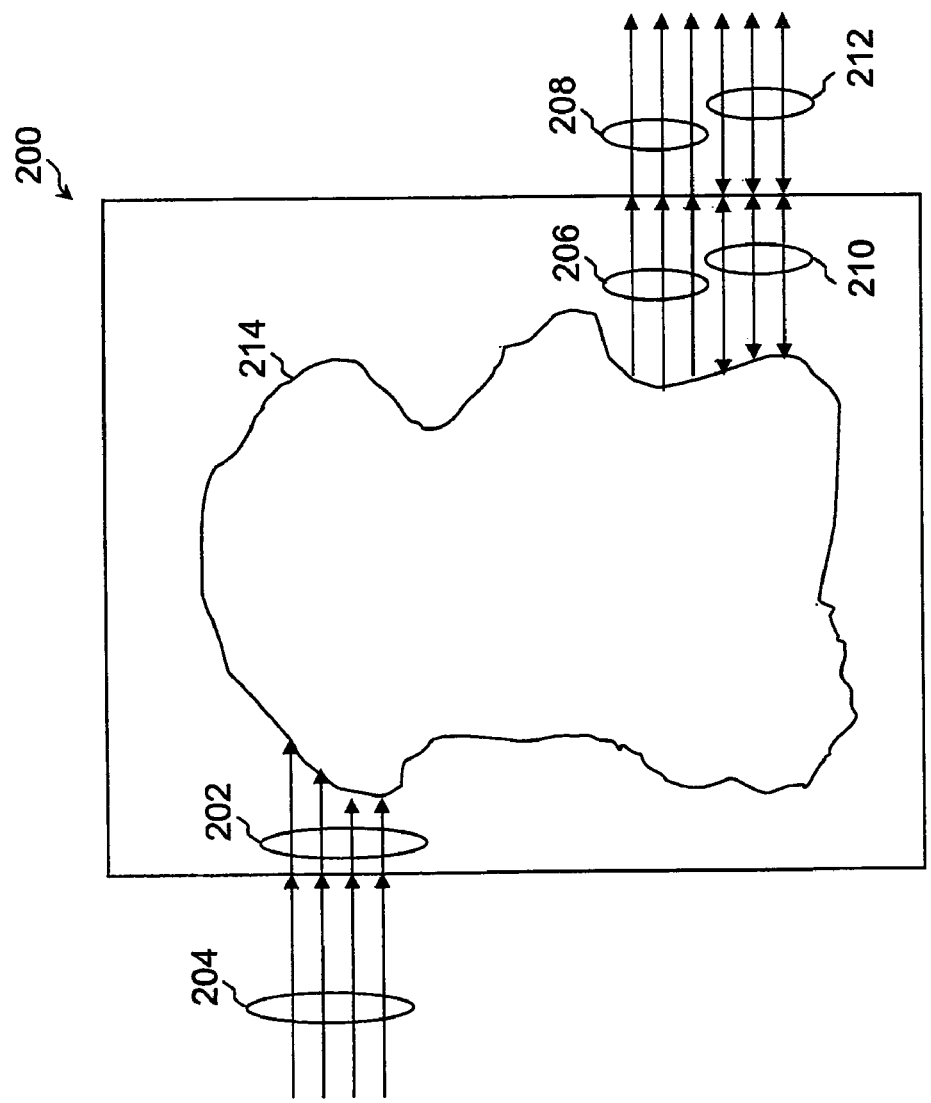
FIG. 2 is a diagrammatic representation of a design entity described by HDL code.

Simulated digital circuit design models created utilizing ECAD system 35 are comprised of at least one, and usually many, sub-units referred to hereinafter as design entities. Referring now to FIG. 2, there is illustrated a block diagram representation of an exemplary design entity 200 which may be created utilizing ECAD system 35. Design entity 200 is defined by a number of components: an entity name, entity ports, and a representation of the function performed by design entity 200. Each design entity within a given model has a unique entity name (not explicitly shown in FIG. 2) that is declared in the HDL description of the design entity. Furthermore, each design entity typically contains a number of signal interconnections, known as ports, to signals outside the design entity. These outside signals may be primary input/outputs (I/Os) of an overall design or signals connected to other design entities within an overall design.

Typically, ports are categorized as belonging to one of three distinct types: input ports, output ports, and bi-directional ports. Design entity 200 is depicted as having a number of input ports 202 that convey signals into design entity 200. Input ports 202 are connected to input signals 204. In addition, design entity 200 includes a number of output ports 206 that convey signals out of design entity 200. Output ports 206 are connected to a set of output signals 208. Bi-directional ports 210 are utilized to convey signals into and out of design entity 200. Bi-directional ports 210 are in turn connected to a set of bi-directional signals 212. A design entity, such as design entity 200, need not contain ports of all three types, and in the degenerate case, contains no ports at all. To accomplish the connection of entity ports to external signals, a mapping technique, known as a "port map", is utilized. A port map (not explicitly depicted in FIG. 2) consists of a specified correspondence between entity port names and external signals to which the entity is connected. When building a simulation model, ECAD software 35 is utilized to connect external signals to appropriate ports of the entity according to a port map specification.

As further illustrated in FIG. 2, design entity 200 contains a body section 214 that describes one or more functions performed by design entity 200. In the case of a digital design, body section 214 contains an interconnection of logic gates, storage elements, etc., in addition to instantiations of other entities. By instantiating an entity within another entity, a hierarchical description of an overall design is achieved. For example, a microprocessor may contain multiple instances of an identical functional unit. As such, the microprocessor itself will often be modeled as a single entity. Within the microprocessor entity, multiple instantiations of any duplicated functional entities will be present.

Each design entity is specified by one or more HDL files that contain the information necessary to describe the design entity. Although not required by the present invention, it will hereafter be assumed for ease of understanding that each design entity is specified by a respective HDL file.

Figure 3:
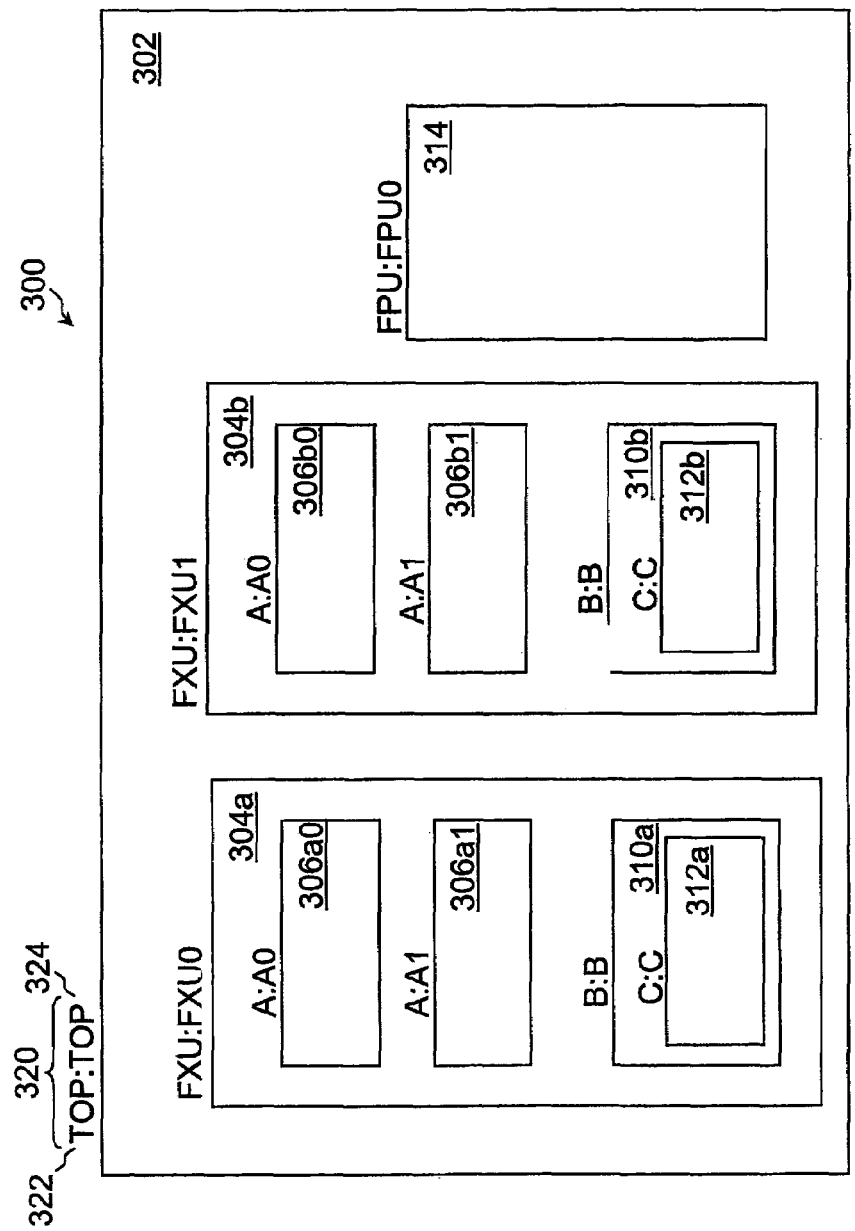
FIG. 3 illustrates an exemplary digital design including a plurality of hierarchically arranged design entities.

With reference now to FIG. 3, there is illustrated a diagrammatic representation of an exemplary simulation model 300 that may be employed by ECAD system 35 to represent a digital design (e.g., an integrated circuit chip or a computer system) in a preferred embodiment of the present invention. For visual simplicity and clarity, the ports and signals interconnecting the design entities within simulation model 300 have not been explicitly shown.

Simulation model 300 includes a number of hierarchically arranged design entities. As within any simulation model, simulation model 300 includes one and only one "top-level entity" encompassing all other entities within simulation model 300. That is to say, top-level entity 302 instantiates, either directly or indirectly, all descendant entities within the digital design. Specifically, top-level entity 302 directly instantiates (i.e., is the direct ancestor of) two instances, 304a and 304b, of the same FiXed-point execution Unit (FXU) entity 304 and a single instance of a Floating Point Unit (FPU) entity 314. FXU entity instances 304, having instantiation names FXU0 and FXU1, respectively, in turn instantiate additional design entities, including multiple instantiations of entity A 306 having instantiation names A0 and A1, respectively.

Each instantiation of a design entity has an associated description that contains an entity name and an instantiation name, which must be unique among all descendants of the direct ancestor entity, if any. For example, top-level entity 302 has a description 320 including an entity name 322 (i.e., the "TOP" preceding the colon) and also includes an instantiation name 324 (i.e., the "TOP" following the colon). Within an entity description, it is common for the entity name to match the instantiation name when only one instance of that particular entity is instantiated within the ancestor entity. For example, single instances of entity B 310 and entity C 312 instantiated within each of FXU entity instantiations 304a and 304b have matching entity and instantiation names. However, this naming convention is not required by the present invention as shown by FPU entity 314 (i.e., the instantiation name is FPU0, while the entity name is FPU).

The nesting of entities within other entities in a digital design can continue to an arbitrary level of complexity, provided that all entities instantiated, whether singly or multiply, have unique entity names and the instantiation names of all descendant entities within any direct ancestor entity are unique with respect to one another.

Associated with each design entity instantiation is a so called "instantiation identifier". The instantiation identifier for a given instantiation is a string including the enclosing entity instantiation names proceeding from the top-level entity instantiation name. For example, the design instantiation identifier of instantiation 312a of entity C 312 within instantiation 304a of FXU entity 304 is "TOP.FXU0.B.C". This instantiation identifier serves to uniquely identify each instantiation within a simulation model.

As discussed above, a digital design, whether realized utilizing physical integrated circuitry or as a software model such as simulation model 300, typically includes configuration latches utilized to configure the digital design for proper operation. In contrast to prior art design methodologies, which employ stand-alone configuration software created after a design is realized to load values into the configuration latches, the present invention introduces a configuration specification language that permits a digital designer to specify configuration values for signals as a natural part of the design process. In particular, the configuration specification language of the present invention permits a design configuration to be specified utilizing statements either embedded in one or more HDL files specifying the digital design (as illustrated in FIG. 4A) or in one or more external configuration files referenced by the one or more HDL files specifying the digital design (as depicted in FIG. 4B).

Figure 4A:
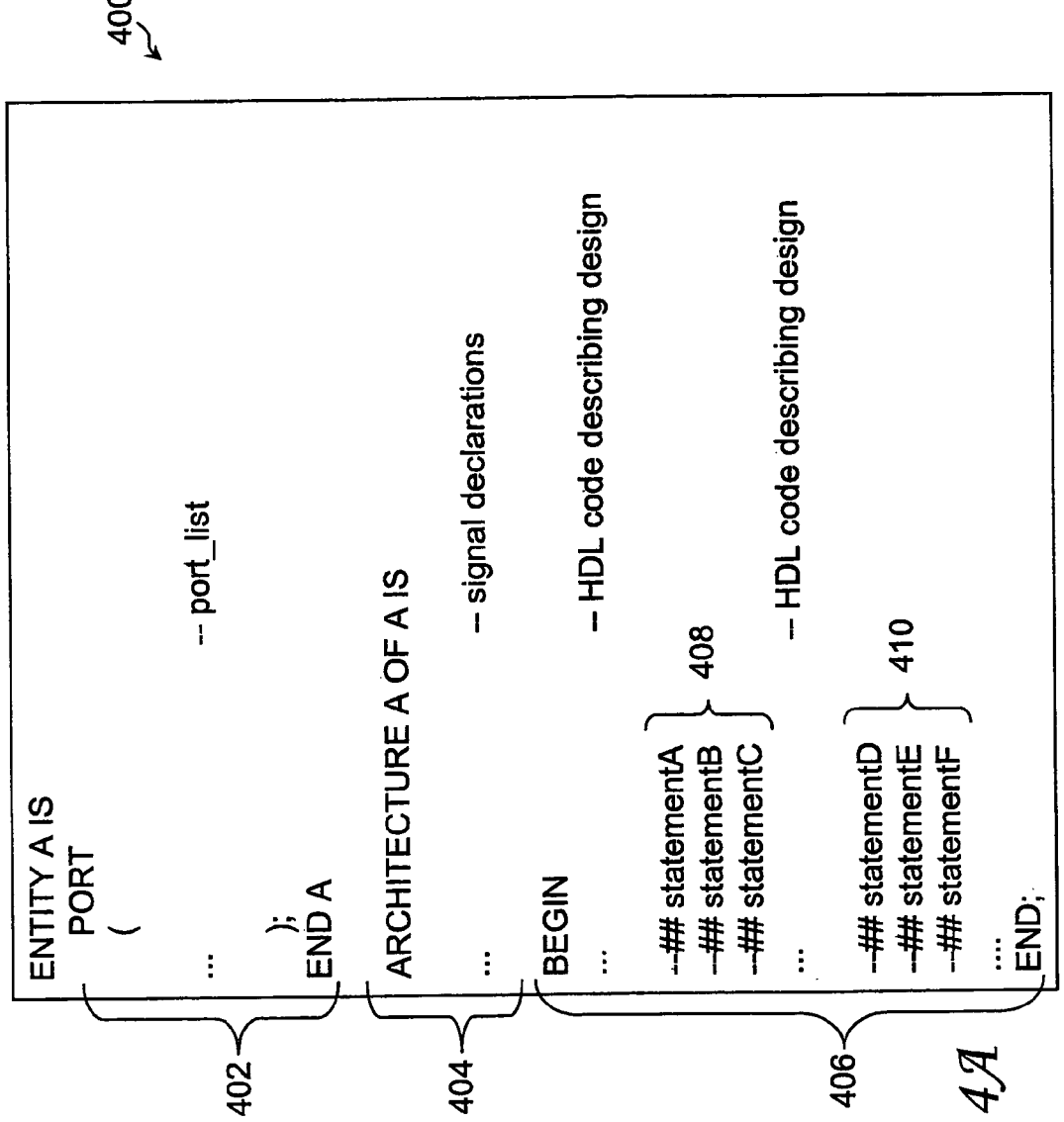
FIG. 4A depicts an exemplary HDL file including embedded configuration specification statements in accordance with the present invention.

Referring now to FIG. 4A, there is depicted an exemplary HDL file 400, in this case a VHDL file, including embedded configuration statements in accordance with the present invention. In this example, HDL file 400 specifies entity A 306 of simulation model 300 and includes three sections of VHDL code, namely, a port list 402 that specifies ports 202, 206 and 210, signal declarations 404 that specify the signals within body section 214, and a design specification 406 that specifies the logic and functionality of body section 214.

Interspersed within these sections are conventional VHDL comments denoted by an initial double-dash ("--"). In addition, embedded within design specification 406 are one or more configuration specification statements in accordance with the present invention, which are collectively denoted by reference numerals 408 and 410. As shown, these configuration specification statements are written in a special comment form beginning with "--##" in order to permit a compiler to easily distinguish the configuration specification statements from the conventional HDL code and HDL comments. Configuration specification statements preferably employ a syntax that is insensitive to case and white space.

Figure 4B:
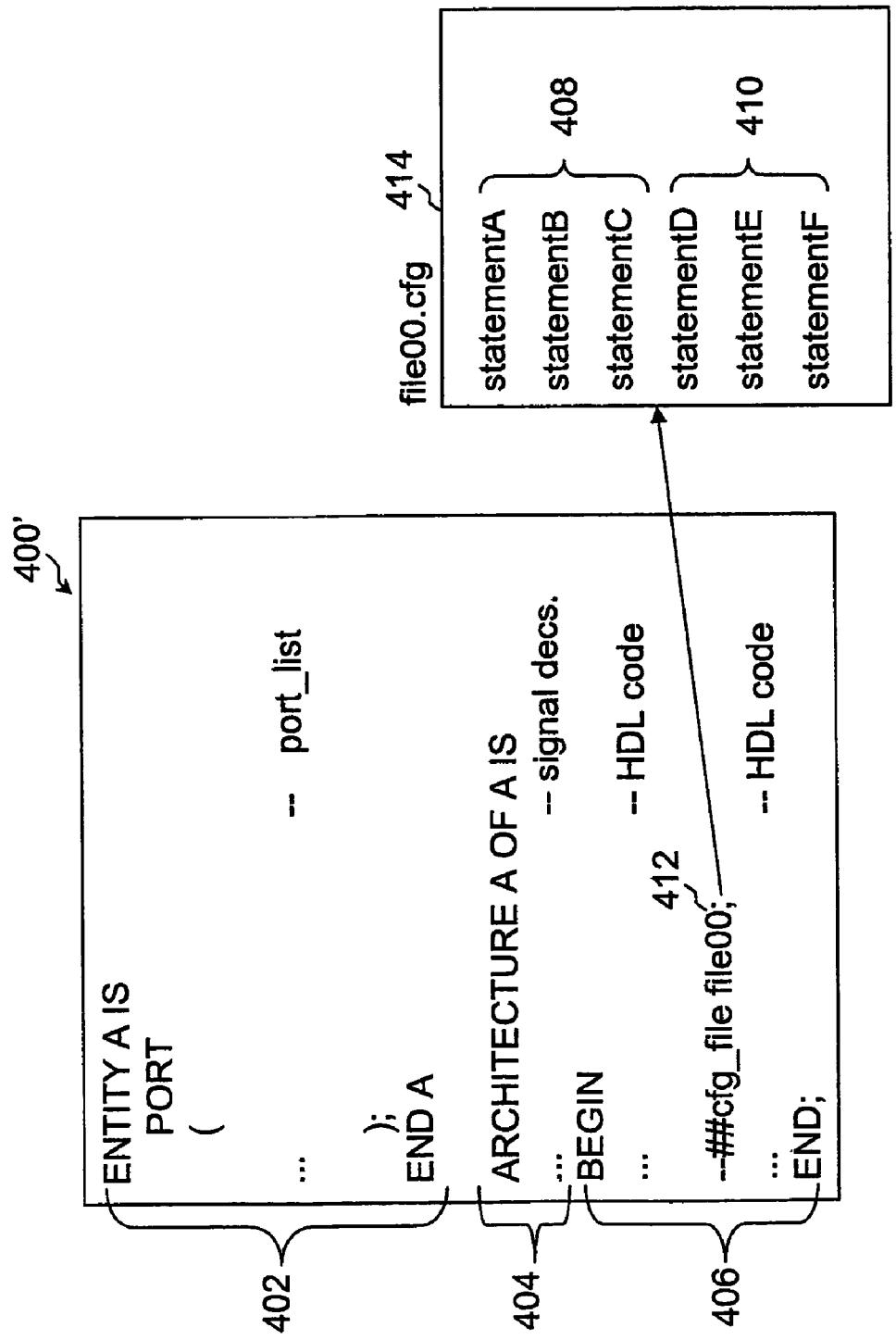
FIG. 4B illustrates an exemplary HDL file including an embedded configuration file reference statement referring to an external configuration file containing a configuration specification statement in accordance with the present invention.

With reference now to FIG. 4B, there is illustrated an exemplary HDL file 400' that includes a reference to an external configuration file containing one or more configuration specification statements in accordance with the present invention. As indicated by prime notation ('), HDL file 400' is identical to HDL file 400 in all respects except that configuration specification statements 408, 410 are replaced with one or more (and in this case only one) configuration file reference statement 412 referencing a separate configuration file 414 containing configuration specification statements 408, 410.

Configuration file reference statement 412, like the embedded configuration specification statements illustrated in FIG. 4A, is identified as a configuration statement by the identifier "--##". Configuration file reference statement 412 includes the directive "cfg_file", which instructs the compiler to locate a separate configuration file 414, and the filename of the configuration file (i.e., "file00"). Configuration files, such as configuration file 412, preferably all employ a selected filename extension (e.g., ".cfg") so that they can be easily located, organized, and managed within the file system employed by data processing system 6.

As discussed further below with reference to FIG. 6, configuration specification statements, whether embedded within an HDL file or collected in one or more configuration files 414, are processed by a compiler together with the associated HDL files.

In accordance with a preferred embodiment of the present invention, configuration specification statements, such as configuration specification statements 408, 410, preferably can be of at least two types: configuration entity instantiation statements and function definition statements. Configuration specification statements can be utilized to facilitate configuration of configuration latches within a digital design by instantiating one or more instances of a configuration entity, such as a configuration entity referred to herein generically as a "Dial." A Dial's function is to map between an input value (including the values of one or more input latches) and one or more output values. In many cases, such output values ultimately directly or indirectly specify configuration values of configuration latches. Each Dial is associated with a particular design entity in the digital design, which by convention is the design entity specified by the HDL source file containing the configuration specification statement or configuration file reference statement that causes the Dial to be instantiated. Consequently, by virtue of their association with particular design entities, which all have unique instantiation identifiers, Dials within a digital design can be uniquely identified as long as unique Dial names are employed within any given design entity. As described in detail in the patent application cross-referenced above, many different types of Dials can be defined, such as a Latch Dial (or "LDial"), an Integer Dial ("IDial"), a Control Dial ("CDial"), etc. In addition, other types of configuration entities, such as Registers, may be defined utilizing configuration specification language in accordance with the present invention, The "scope" of a Dial is defined herein as the set of entities to which the Dial can refer in its specification. By convention, the scope of a Dial comprises the design entity with which the Dial is associated (i.e., the design entity specified by the HDL source file containing the configuration specification statement or configuration file reference statement that causes the Dial to be instantiated) and any design entity contained within the associated design entity (i.e., the associated design entity and its descendents). Thus, a Dial is not constrained to operate at the level of the design hierarchy at which it is instantiated, but can also specify configuration latches at any lower level of the design hierarchy within its scope.

The configuration specification statement instantiating a Dial, such as an EDial (Error checking Dial) described in detail below with reference to FIGS. 5A-5B, may incorporate into the Dial definition a named function defined by a function definition statement. In general, a function definition statement employs an HDL-like syntax to define the values of the output bits of the function in terms of the input bits and one or more mathematical and/or logical operations. An exemplary syntax for a function definition statement is as follows:

```
func function_name (input_expr=>output_expr)={operation}
``` wherein "func" identifies the statement as a function definition statement, "function_name" is the name by which the function can be referred in other configuration specification statements, "input_expr" identifies one or more input bits of the function, "output_expr" identifies one or more output bits of the function, and "operation" indicates one or more mathematical or logical operations relating the output bits and input bits. In the operation field of the function definition statement, all input bits identified in input_expr must be referenced and all output bits must be assigned values. It is preferable (but not required) for clarity and simplicity, if output bits are only defined with reference to input bits rather than in terms of other output bits. Using this syntax, an exemplary function definition statement for an ECC function can be given as follows:

```
func ecc_func (in(0 to 10) => out(0 to 3)) = {
    out(0) = xor (in(0 to 1), in(3 to 4), ~in(6), ~in(8), in(10));
    out(1) = xor (in(0), in(3 downto 2), not(in(5 to 7)), in(9 to 10)));
    out(2) = xor (in(1 to 3), in(7 to 10));
    out(3) = xnor (in(4 to 10));
};
``` where "~" is the NOT operator, "xor" indicates a bit-wise XOR operation, and "xnor" indicates a bit-wise XNOR operation. Thus, for example, the value of out(1) is computed as:

```
out(1)=in(0) XOR in(3) XOR in(2) XOR
    (NOT(in(5)) XOR NOT(in(6)) XOR NOT(in(7)) XOR NOT
    (in(9)) XOR NOT(in(10))))
```

Of course, other functions, such as parity functions, can similarly be defined.

Like Dials, functions may also advantageously be deemed to have an associated scope, meaning that a function can be referenced only by a Dial within the design entity where the function is declared either by definition or by an "include" configuration specification statement identifying the function name. In the case of declaration with an "include" statement, the function may be defined (possibly with other functions) in a separate configuration file 414. As a consequence of the use of scope, each design entity has its own namespace for functions, meaning that two different functions sharing the same name can be declared in different design entities without ambiguity.

Figure 5A:
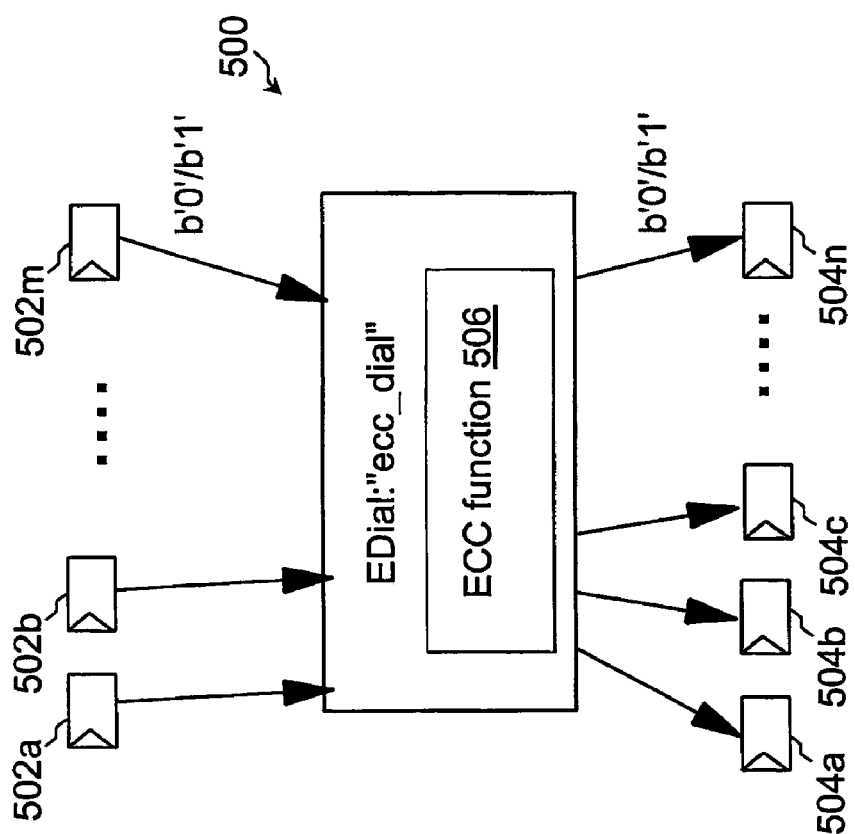
FIG. 5A is a diagrammatic representation of an EDial primitive in accordance with the present invention.

Referring now to FIG. 5A, there is depicted a diagrammatic representation of an exemplary EDial 500 that may be instantiated utilizing a configuration specification language in accordance with the present invention. In this particular example, EDial 500, which has the name "ecc_dial", is utilized to specify values for output latches 504a-504n in a digital design by applying a function (e.g., an ECC (Error Correcting Code) function 506) to the value of input latches 502a-502m. An EDial, such as EDial 500, can be instantiated utilizing a configuration specification statement of the following syntax:

```
EDial dial_name=function_name
    (input_expr=>output_expr);
``` where "dial_name" is the name of the EDial, "function_name" is the name of a predefined function (e.g., "ecc_function" defined above) incorporated by reference, "input_expr" identifies one or more input bits of the function, and "output_expr" identifies one or more output bits of the function. An exemplary EDial configuration specification statement employing this syntax is as follows:

```
EDial ecc_check = ecc_func (data(3), data(5 to 7), data(9 to 15) =>
    data(1 to 2), data(4), data(8));
```

The exemplary configuration specification statement given above begins with the keyword "EDial," which specifies that the type of Dial being declared is an EDial, and the Dial name, which in this case is "ecc_check." Next, the configuration specification statement incorporates the predefined function "ecc_func" and then enumerates the input signal names providing input bits and the output signal names. As indicated above, the signal identifier for each signal is specified hierarchically relative to the default scope of the associated design entity so that different signal instances having the same signal name are distinguishable. The input bits and output bits of the function are associated with the input and output signal names implicitly by the order in which the signal names are declared. Of course, the incorporation by reference of the function in this manner requires that the function definition statement or an include statement identifying a configuration file containing the function definition statement be included within the HDL file defining the design entity in which the EDial is instantiated.

If a function is not likely to be reused by multiple EDials, a designer also has the option of including the function definition inline within the configuration specification statement that instantiates an EDial. In this case, the configuration specification statement instantiating an EDial can employ the following alternative syntax:

```
EDial dial_name (input_expr=>output_expr)={operation};
``` where "dial_name" is the name of the EDial, "input_expr" identifies one or more input bits of the function, "output_expr" identifies one or more output bits of the function, and "operation" defines the mathematical and/or logical function(s) relating the input bits and output bits. Using this alternative syntax, the EDial named ecc_check may alternatively be instantiated with the following functionally equivalent configuration specification statement

```
EDial ecc_check = (data(3), data(5 to 7), data(9 to 15) =>
    data(1 to 2), data(4), data(8)) ={
    data(1) = xor (data(3)), data(5), data(7), data(9),
        ~data(11), ~data(13), data(15));
    data(2) = xor (data(3)), data(6 to 7), not(data(10 to 11),
        , data(14 to 15));
    data(4) = xor (data(5 to 7), data(12 to 15));
    data(8) = xnor (data(9 to 15));
    };
```

Although it is possible for an EDial to automatically update its associated output latches 504a-504n in response to an update to one or more of input latches 502a-502m, it is preferred if output latches 504a-504n are updated only in response to an explicit application call (e.g., a set_Dial( ) API call described in detail below).

Figure 5B:
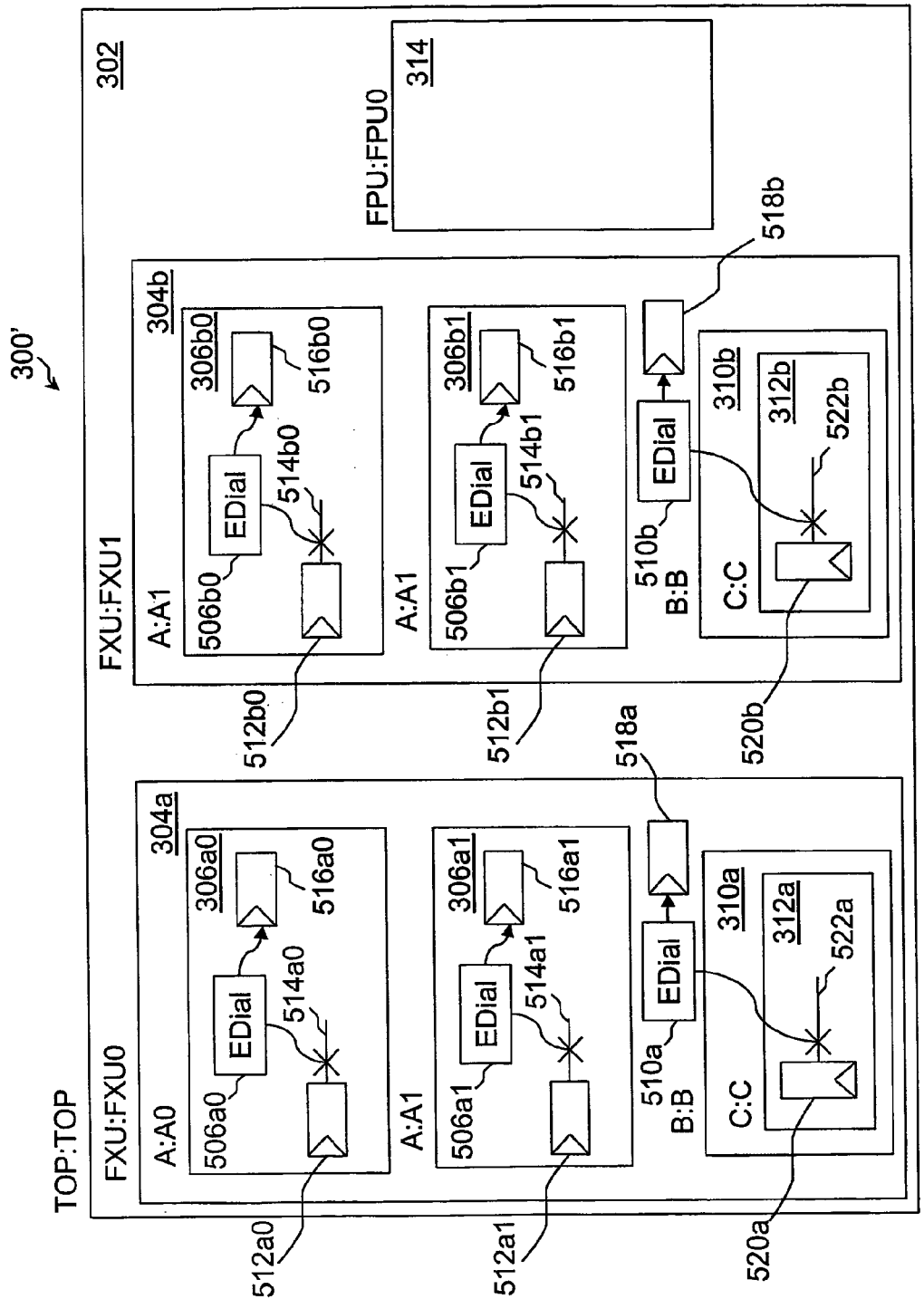
FIG. 5B depicts an exemplary digital design including a plurality of hierarchically arranged design entities in which EDials are instantiated in accordance with the present invention.

With reference now to FIG. 5B, there is illustrated a diagrammatic representation of a simulation model logically including EDials in accordance with the present invention. Simulation model 300' of FIG. 5B, which as indicated by prime notation includes the same design entities arranged in the same hierarchical relation as simulation model 300 of FIG. 3, illustrates two properties of Dials, namely, replication and scope.

Replication is a process by which a Dial that is specified in or referenced by an HDL file of a design entity is automatically instantiated each time that the associated design entity is instantiated. Replication advantageously reduces the amount of data entry a designer is required to perform to create multiple identical instances of a Dial. For example, in order to instantiate the six instances of the EDials illustrated in FIG. 5B, the designer need only code two EDial configuration specification statements utilizing either of the two techniques illustrated in FIGS. 4A and 4B. That is, the designer codes a first EDial configuration specification statement (or configuration file reference statement pointing to an associated configuration file) into the HDL file of design entity A 306 in order to automatically instantiate EDials 506a0, 506a1, 506b0 and 506b1 within entity A instantiations 306a0, 306a1, 306b0 and 306b1, respectively. The designer codes a second EDial configuration specification statement (or configuration file reference statement pointing to an associated configuration file) into the HDL file of design entity FXU 304 in order to automatically instantiate LDials 510a and 510b within FXU entity instantiations 304a and 304b, respectively. The multiple instances of the EDials are then created automatically as the associated design entities are replicated by the compiler. Replication of Dials within a digital design can thus significantly reduce the input burden on the designer as compared to prior art methodologies in which the designer had to individually enumerate in the configuration software each configuration latch value by hand. It should be noted that the property of replication does not necessarily require all instances of a Dial to have the same input values or output values; different instances of the same Dial can be set to generate different outputs by providing them different inputs.

FIG. 5B further illustrates the property of scope by which a Dial is not constrained to operate at the level of the design hierarchy at which it is instantiated, but can also specify input latches 512, 520 and output latches 516, 518 at the same level or any lower level of the design hierarchy within its scope. For example, EDials 510a and 510b, even though associated with FXU entity instantiations 304a and 304b, respectively, can specify input latches at a lower hierarchy level within entity C instantiations 312a and 312b, respectively, and output latches at a same hierarchy level within FXU entity instantiations 304a and 304b, respectively.

FIG. 5B illustrates another important property of EDials (and other Dials that directly specify latch values). In particular, as shown diagrammatically in FIG. 5B, designers, who are accustomed to specifying signals in HDL files, are permitted in a configuration specification statement to specify signal states set by a Dial rather than values to be loaded into an "upstream" configuration latch that determines the signal state. Thus, in specifying EDial 506, the designer can specify possible signal states for a signal 514 set by a configuration latch 512. Similarly, in specifying EDial 510, the designer can specify possible signal states for signal 522 set by configuration latch 520. The ability to specify signal states rather than latch values not only coincides with designers' customary manner of thinking about a digital design, but also reduces possible errors introduced by the presence of inverters between the configuration latch 512, 520 and the signal of interest 514, 522.

It should further be noted that input latches, such as input latches 512, 520 may be (but need not be) controlled by another Dial, such as an LDial or IDial. However, output latches, such as output latches 516, 518, are preferably restricted (by a configuration compiler 808, described below) from being controlled by any other Dial that may set the latch values and may not be used as input latches of any other Dial.

Figure 6:
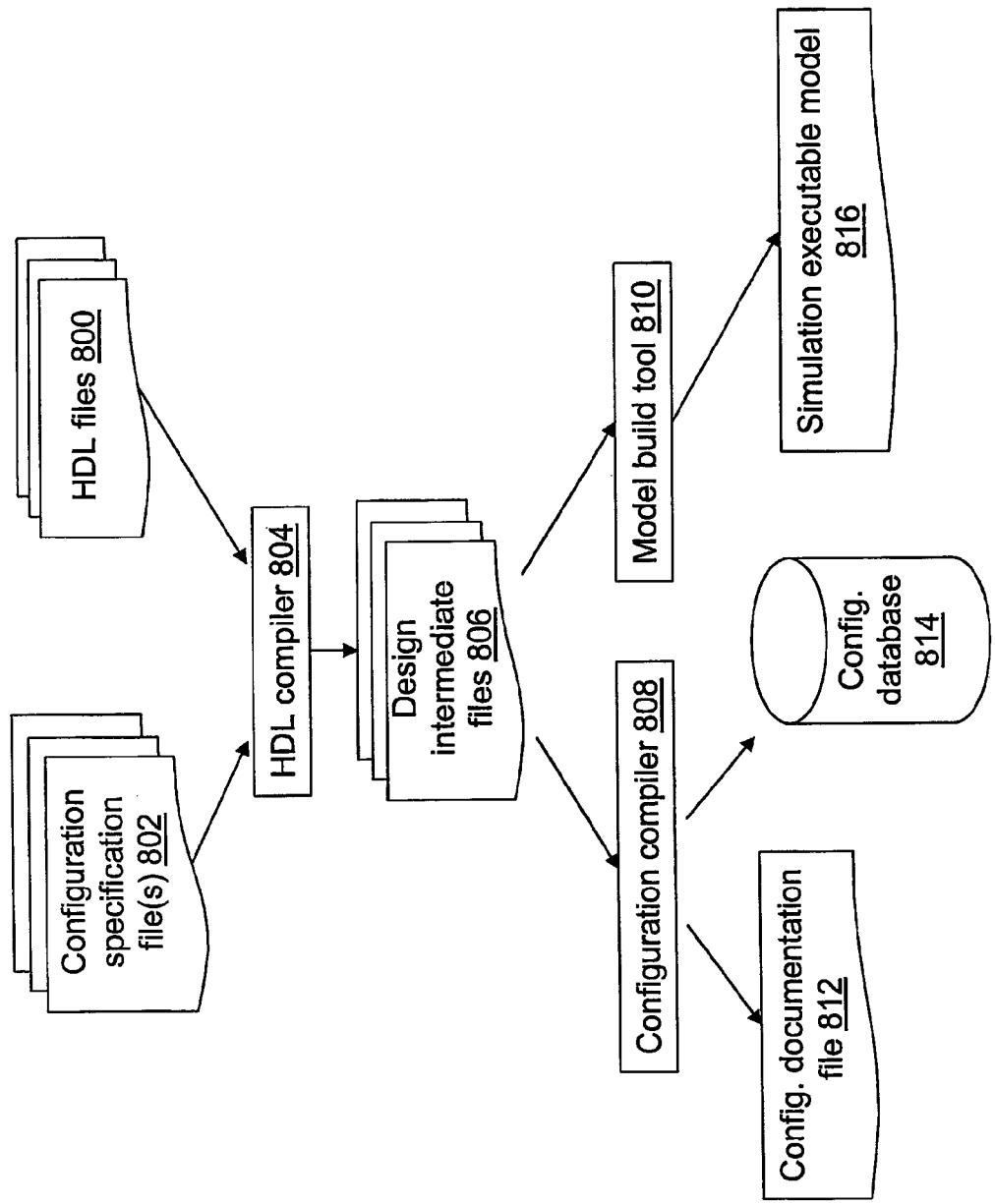
FIG. 6 is a high level flow diagram of a model build process utilized to produce a simulation executable model and associated simulation configuration database in accordance with the present invention.

Referring now to FIG. 6, there is depicted a high level flow diagram of a model build process in which HDL files containing configuration statements are compiled to obtain a simulation executable model and a simulation configuration database for a digital design. The process begins with one or more design entity HDL source code files 800, which include configuration specification statements and/or configuration file reference statements, and, optionally, one or more configuration specification reference files 802. HDL compiler 804 processes HDL file(s) 800 and configuration specification file(s) 802, if any, beginning with the top level entity of a simulation model and proceeding in a recursive fashion through all HDL file(s) 800 describing a complete simulation model. As HDL compiler 804 processes each HDL file 800, HDL compiler 804 creates "markers" in the design intermediate files 806 produced in memory to identify configuration statements embedded in the HDL code and any configuration specification files referenced by an embedded configuration file reference statement.

Thereafter, the design intermediate files 806 in memory are processed by a configuration compiler 808 and model build tool 810 to complete the model build process. Model build tool 810 processes design intermediate files 806 into a simulation executable model 816, that when executed, models the logical functions of the digital design, which may represent, for example, a portion of an integrated circuit, an entire integrated circuit or module, or a digital system including multiple integrated circuits or modules. In this processing, model build tool 810 preferably generates an m-way tree indicating the hierarchical relationships between the design entities comprising the simulation model.

Configuration compiler 808 processes the configuration specification statements marked in design intermediate files 806 and creates from those statements a configuration documentation file 812 and a configuration database 814. Configuration documentation file 812 lists, in human-readable format, information describing the Dials associated with the simulation model. The information includes the Dials' names, their mapping tables or functions, the structure of Dial trees, if any, instance information, etc. In addition, as noted above, configuration documentation file 812 includes strings contained in comment statements describing the functions and settings of the Dials in the digital design. In this manner, configuration documentation suitable for use with both a simulation model and a hardware implementation of a digital design is aggregated in a "bottom-up" fashion from the designers responsible for creating the Dials. The configuration documentation is then made available to all downstream organizational groups involved in the design, simulation, laboratory hardware evaluation, and commercial hardware implementation of the digital design.

Configuration database 814 preferably contains the m-way tree generated by model build tool 810 that describes the hierarchical relationships of the design entities within simulation executable model 816, as well as a number of data structures pertaining to Dials and other configuration entities. As described in detail below, these data structures include Dial data structures describing Dial entities, latch data structures, and Dial instance data structures. These data structures associate particular Dial inputs with particular configuration values used to configure the digital design (i.e., simulation executable model 816). In a preferred embodiment, the configuration values can be specified in terms of either signal states or configuration latch values, and the selection of which values are used is user-selectable. Configuration database 814 is accessed via Application Programming Interface (API) routines during simulation of the digital design utilizing simulation executable model 816 and is further utilized to generate similar configuration databases for configuring physical realizations of the digital design. In a preferred embodiment, the APIs are designed so that only top-level Dials (i.e., EDials, LDials, IDials or CDials without a CDial logically "above" them) can be set and all Dial values can be read.

Now that basic types of Dials, syntax for their specification, and their application have been described, a description of an exemplary implementation of configuration database 814 and its use will be provided. To promote understanding of the manner in which particular Dial instantiations (or multiple instantiations of a Dial) can be accessed in configuration database 814, a nomenclature for Dials within configuration database 814 will be described.

The nomenclature employed in a preferred embodiment of the present invention first requires a designer to uniquely name each Dial specified within any given design entity, i.e., the designer cannot declare any two Dials within the same design entity with the same Dial name. Observing this requirement prevents name collisions between Dials instantiated in the same design entity and promotes the arbitrary re-use of design entities in models of arbitrary size. This constraint is not too onerous in that a given design entity is usually created by a specific designer at a specific point in time, and maintaining unique Dial names within such a limited circumstance presents only a moderate burden.

Because it is desirable to be able to individually access particular instantiations of a Dial entity that may have multiple instantiations in a given simulation model (e.g., due to replication), use of a Dial name alone is not guaranteed to uniquely identify a particular Dial entity instantiation in a simulation model. Accordingly, in a preferred embodiment, the nomenclature for Dials leverages the unique instantiation identifier of the associated design entity required by the native HDL to disambiguate multiple instances of the same Dial entity with an "extended Dial identifier" for each Dial within the simulation model.

As an aside, it is recognized that some HDLs do not strictly enforce a requirement for unique entity names. For example, conventional VHDL entity naming constructs permit two design entities to share the same entity name, entity_name. However, VHDL requires that such identically named entities must be encapsulated within different VHDL libraries from which a valid VHDL model may be constructed. In such a circumstance, the entity_name is equivalent to the VHDL library name concatenated by a period (".") to the entity name as declared in the entity declaration. Thus, pre-pending a distinct VHDL library name to the entity name disambiguates entities sharing the same entity name. Most HDLs include a mechanism such as this for uniquely naming each design entity.

In a preferred embodiment, an extended Dial identifier that uniquely identifies a particular instantiation of a Dial entity includes three fields: an instantiation identifier field, a design entity name, and a Dial name. The extended Dial identifier may be expressed as a string in which adjacent fields are separated by a period (".") as follows:

<instantiation identifier>.<design entity name>.<Dial name>

In the extended Dial identifier, the design entity field contains the entity name of the design entity in which the Dial is instantiated, and the Dial name field contains the name declared for the Dial in the Dial configuration specification statement. As described above, the instantiation identifier specified in the instantiation identifier field is a sequence of instantiation identifiers, proceeding from the top-level entity of the simulation model to the direct ancestor design entity of the given Dial instance, with adjacent instance identifiers separated by periods ("."). Because no design entity can include two Dials of the same name, the instantiation identifier is unique for each and every instance of a Dial within the model.

The uniqueness of the names in the design entity name field is a primary distinguishing factor between Dials. By including the design entity name in the extended Dial identifier, each design entity is, in effect, given a unique namespace for the Dials associated with that design entity, i.e., Dials within a given design entity cannot have name collisions with Dials associated with other design entities. It should also be noted that it is possible to uniquely name each Dial by using the instantiation identifier field alone. That is, due to the uniqueness of instantiation identifiers, Dial identifiers formed by only the instantiation identifier field and the Dial name field will be necessarily unique. However, such a naming scheme does not associate Dials with a given design entity. In practice, it is desirable to associate Dials with the design entity in which they occur through the inclusion of the design entity field because all the Dials instantiations can then be centrally referenced without the need to ascertain the names of all the design entity instantiations containing the Dial.

Figure 7A:
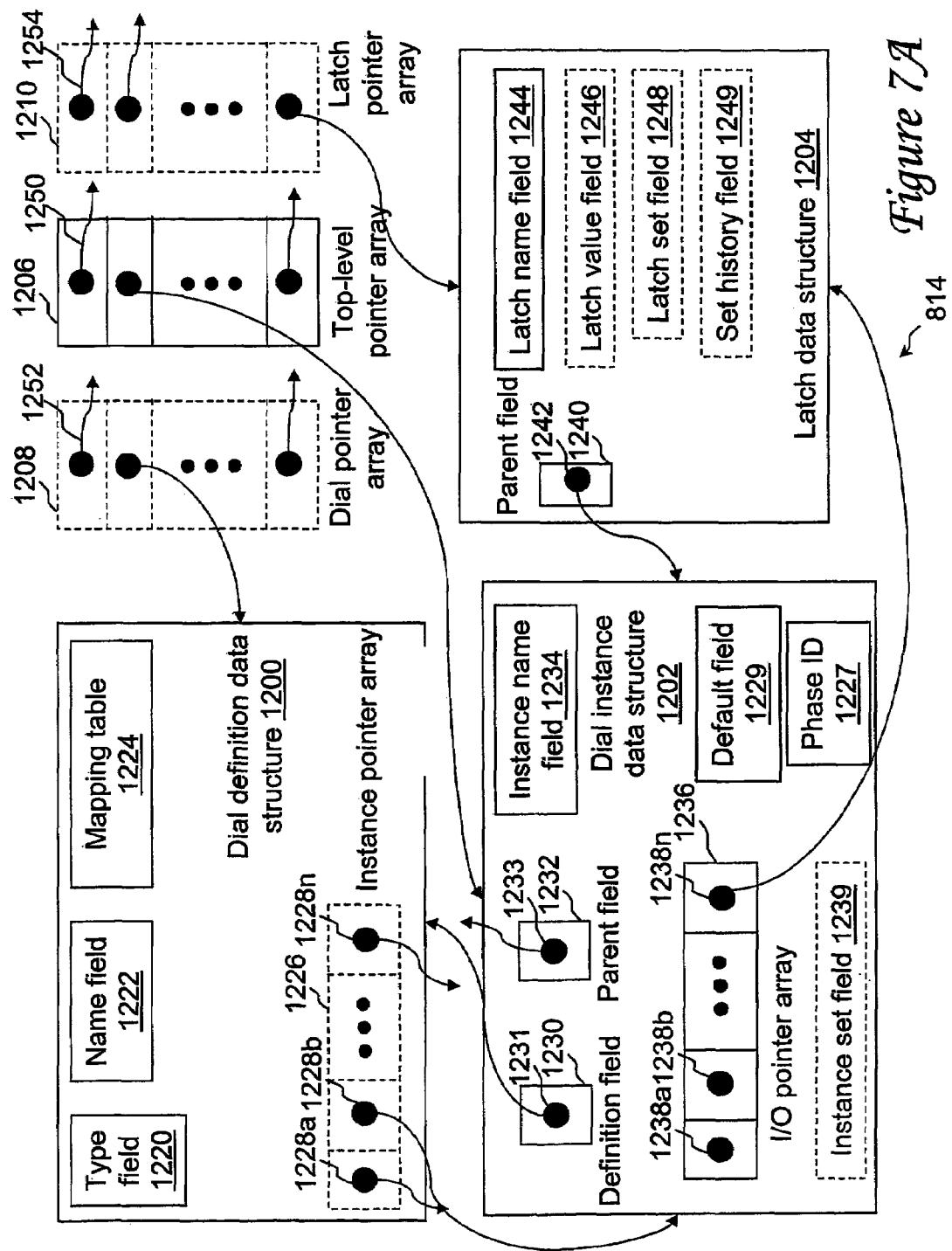
FIG. 7A depicts an exemplary embodiment of a simulation configuration database in accordance with the present invention.

With an understanding of a preferred nomenclature of Dials, reference is now made to FIG. 7A, which is a diagrammatic representation of an exemplary format for a configuration database 814 created by configuration compiler 808. In this exemplary embodiment, configuration database 814 includes at least four different types of data structures: Dial definition data structures (DDDS) 1200, Dial instance data structures (DIDS) 1202, latch data structures 1204 and top-level pointer array 1206. Configuration database 814 may optionally include additional data structures, such as Dial pointer array 1208, latch pointer array 1210, instance pointer array 1226 and other data structures depicted in dashed-line illustration, which may alternatively be constructed in volatile memory when configuration database 814 is loaded, as described further below. Generating these additional data structures only after configuration database 814 is loaded into volatile memory advantageously promotes a more compact configuration database 814.

A respective Dial definition data structure (DDDS) 1200 is created within configuration database 814 for each Dial (or other configuration entity) in the digital system. Preferably, only one DDDS 1200 is created in configuration database 814 regardless of the number of instantiations of the Dial (or other configuration entity) in the digital system. As discussed below, information regarding particular instantiations of a Dial described in a DDDS 1200 is specified in separate DIDSs 1202.

As shown, each DDDS 1200 includes a type field 1220 denoting whether DDDS 1200 describes a Dial, and if so, the type of Dial. In one embodiment, the value set for type field 1220 includes "I" for integer Dial (IDial), "L" for latch Dial (LDial), and "C" for control Dial (CDial), and "E" for error checking Dial (EDial). DDDS 1200 further includes a name field 1222, which specifies the name of the Dial described by DDDS 1200. This field preferably contains the design entity name of the Dial, followed by a period ("."), followed by the name of Dial given in the configuration specification statement of the Dial. The contents of name field 1222 correspond to the design entity name and Dial name fields of the extended dial identifier for the Dial.

DDDS 1200 also includes a mapping table 1224 that contains the mapping from the input of the given Dial to its output(s), if required. For LDials and CDials, mapping table 1224 specifies relationships between input values and output values much like the configuration specification statements for these Dials. For EDials, mapping table 1220 specifies the function that is either incorporated by reference or defined inline within the configuration specification statement instantiating the EDial.

Finally, DDDS 1200 may include an instance pointer array 1226 containing one or more instance pointers 1228a-1228n pointing to each instance of the Dial defined by the DDDS 1200. Instance pointer array 1226 facilitates access to multiple instances of a particular Dial.

As further illustrated in FIG. 7A, configuration database 814 contains a DIDS 1202 corresponding to each Dial (or other configuration entity) instantiation within a digital design. Each DIDS 1202 contains a definition field 1230 containing a definition pointer 1231 pointing to the DDDS 1200 of the Dial for which the DIDS 1202 describes a particular instance. Definition pointer 1231 permits the Dial name, Dial type and mapping table of an instance to be easily accessed once a particular Dial instance is identified.

DIDS 1202 further includes a parent field 1232 that, in the case of an IDial, CDial or LDial, contains a parent pointer 1233 pointing to the DIDS 1202 of the higher-level Dial instance, if any, having an output logically connected to the input of the corresponding Dial instance. If the Dial instance corresponding to a DIDS 1202 is a top-level Dial (EDials are always top-level Dials), parent pointer 1233 in parent field 1232 is a NULL pointer.

Thus, parent fields 1232 of the DIDSs 1202 in configuration database 814 collectively describe the hierarchical arrangement of Dial entities that are instantiated in a digital design. As described below, the hierarchical information provided by parent fields 1232 advantageously enables a determination of the input value of any top-level Dial given the configuration values of the configuration latches ultimately controlled by that top-level Dial.

Instance name field 1234 of DIDS 1202 gives the fully qualified instance name of the Dial instance described by DIDS 1202 from the top-level design entity of the digital design. For Dial instances associated with the top-level entity, instance name field 1234 preferably contains a NULL string.

DIDS 1202 may further include a default field 1229, a phase ID field 1227, and a instance set field 1239. At compile time, configuration compiler 808 preferably initially inserts a default field 1229 into at least each DIDS 1202 for which the configuration specification statement for the associated Dial has a default specified (EDials do not have default values). Default field 1229 stores the specified default value; if no default value is specified, default field 1229 is NULL or is omitted. Configuration compiler 808 subsequently analyzes configuration database 814 utilizing a recursive traversal and removes (or set to NULL) the default field 1229 of any Dial instance that has an ancestor Dial instance having a default. In this manner, default values of Dial instances higher in the hierarchy override defaults specified for lower level Dial instances. For each remaining (or non-NULL) default field 1229, configuration compiler 808 inserts into the DIDS 1202 a phase ID field 1227 for storing one or more phase IDs, if any, associated with the default value. The phase ID(s) stored within phase ID field 1227 may be specified within a Dial definition statement within an HDL file 800 or configuration specification file 802, or may alternatively be supplied by direct manipulation of configuration database 814 by a downstream user.

As indicated by dashed-line notation, an instance set field 1239 is preferably inserted within each DIDS 1302 in configuration database 814 when configuration database 814 is loaded into volatile memory. Instance set field 1239 is a Boolean-valued field that in initialized to FALSE and is updated to TRUE when the associated Dial instance is explicitly set.

Finally, DIDS 1202 includes an input/output (I/O) pointer array 1236 containing pointers 1238*a*-1238*n* pointing to data structures describing the entity instantiations associated with the corresponding Dial instance. Specifically, in the case of IDials and LDials, pointers 1238 refer to latch data structures 1204 corresponding to the configuration latches coupled to the Dial instance. For non-split IDials, the configuration latch entity referred to by pointer 1238*a* receives the high order bit of the integer input value, and the configuration latch entity referred to by pointer 1238*n* receives the low order bit of the integer input value. In the case of a CDial, pointers 1238 refer to other DIDSs 1202 corresponding to the Dial instances controlled by the CDial. For EDials, pointers 1238 refer to the latch data structures 1204 corresponding to the input and output latches coupled to the EDial instance. Pointers 1238 are ordered according to the order in which the input latches and then the output latches are enumerated in the function specified within mapping table 1224. (In alternative embodiments of the present invention, separate input and output pointer arrays may be employed to identify input and output latches, respectively.)

Configuration database 814 further includes a respective latch data structure 1204 for each latch in simulation executable model 816 to which an output of an LDial or IDial is logically coupled or to which an input or output of an EDial is logically coupled. Each latch data structure 1204 includes a parent field 1240 containing a parent pointer 1242 to the DIDS 1200 of the LDial, IDial or EDial, if any, having an output directly coupled to the corresponding latch. In addition, latch data structure 1204 includes a latch name field 1244 specifying the hierarchical latch name, relative to the entity containing the Dial instantiation identified by pointer 1242. For example, if an LDial X having an instantiation identifier a.b.c refers to a configuration latch having the hierarchical name "a.b.c.d.latch1", latch name field 1244 will contain the string "d.latch1". Prepending contents of an instance name field 1234 of the DIDS 1202 identified by pointer 1242 to the contents of a latch name field 1244 thus provides the fully qualified name of any instance of a given latch referenced by configuration database 814.

As shown, latch data structures 1204 may further be augmented with a latch value field 1246, latch set field 1248 and set history field 1249 when configuration database 814 is loaded into volatile memory for use in a simulation run. These fields and their use are described in detail in the above-referenced application.

Still referring to FIG. 7A, as noted above, configuration database 814 includes top-level pointer array 1206, and optionally, Dial pointer array 1208 and latch pointer array 1210. Top-level pointer array 1206 contains top-level pointers 1250 that, for each top-level Dial, points to an associated DIDS 1202 for the top-level entity instance. Dial pointer array 1208 includes Dial pointers 1252 pointing to each DDDS 1200 in configuration database 814 to permit indirect access to particular Dial instances through Dial and/or entity names. Finally, latch pointer array 1210 includes latch pointers 1254 pointing to each latch data structure 1204 within configuration database 814 to permit easy access to all latches.

Figure 7B:
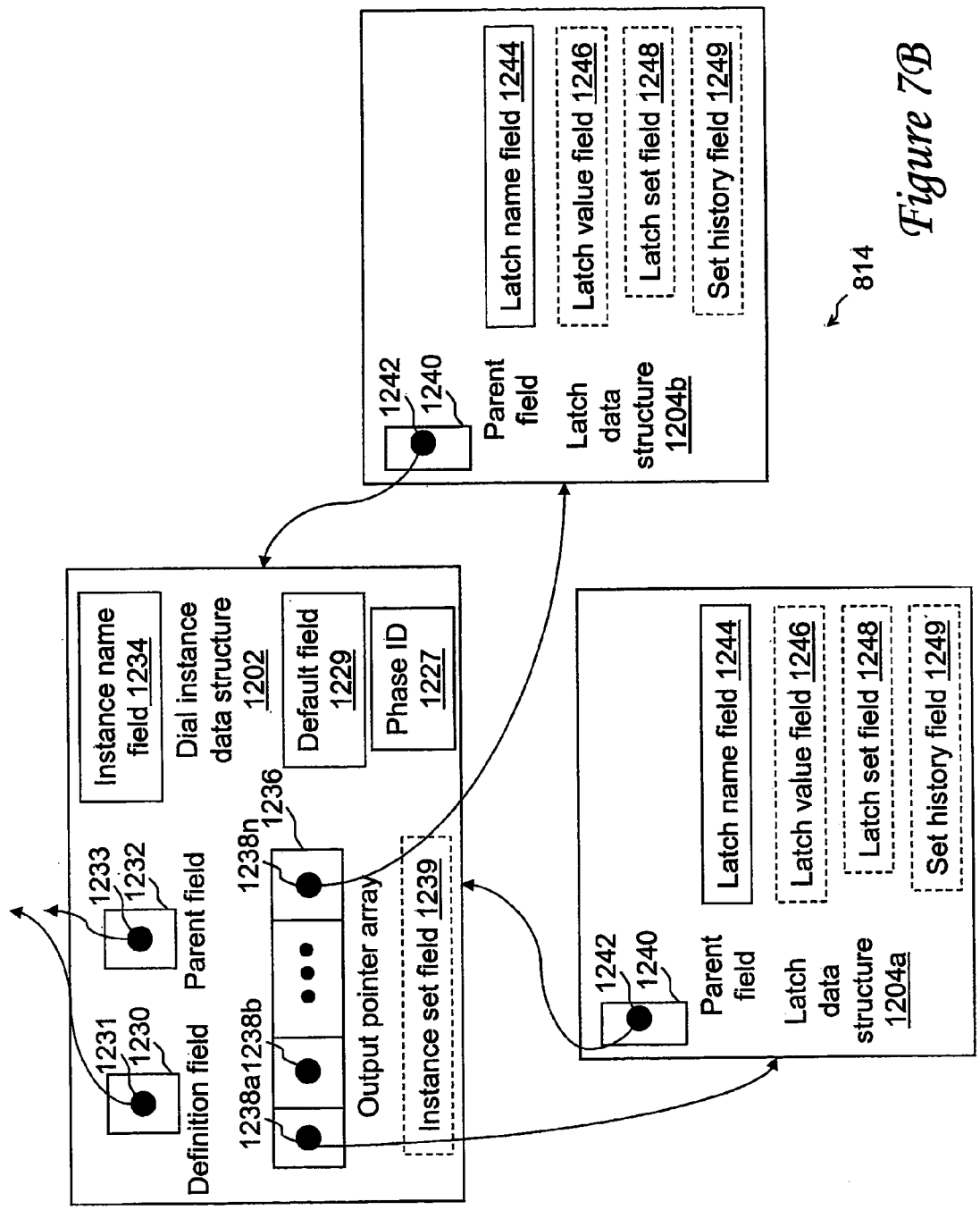
FIG. 7B is a more detailed view of an exemplary simulation configuration database including data structures representing Dials and Registers in accordance with the present invention.

Referring now to FIG. 7B, there is illustrated a more detailed view of a portion of an exemplary simulation configuration database 814 including data structures representing EDials in accordance with the present invention. In order to avoid unnecessary complexity some features of simulation configuration database 814 shown in FIG. 7A are omitted from FIG. 7B.

Turning now to a consideration of the figure, FIG. 7B illustrates two latch data structures 1204*a*, 1204*b*, respectively representing an input latch and an output latch of an EDial within a digital design. The EDial receiving the value of the input latch associated with latch data structure 1204*a* and producing the value of the output latch associated with latch data structure 1204*b* is represented within simulation configuration database 814 by DIDS 1202, as discussed above with respect to FIG. 7A. To represent the logical connections between the EDial and the latches, latch data structure 1204*a* includes a parent field 1240 containing a parent pointer 1242 pointing to a DIDS 1202, and latch data structure 1204*b* includes a parent pointer 1242 within its parent field 1240 that points to DIDS 1202.

Once a configuration database 814 is constructed in accordance with FIGS. 7A-7B by the process of FIG. 6, the contents of configuration database 814 can be loaded into volatile memory, such as system memory 18 of data processing system 8 of FIG. 1, in order to appropriately configure a simulation model for simulation. In general, data structures 1200, 1202, 1204 and 1206 can be loaded directly into system memory 18, and may optionally be augmented with additional fields, as described below. However, as noted above, if it is desirable for the non-volatile image of configuration database 814 to be compact, it is helpful to generate additional data structures, such as Dial pointer array 1208, latch pointer array 1210 and instance pointer arrays 1226, in the volatile configuration database image in system memory 18.

Figure 8:
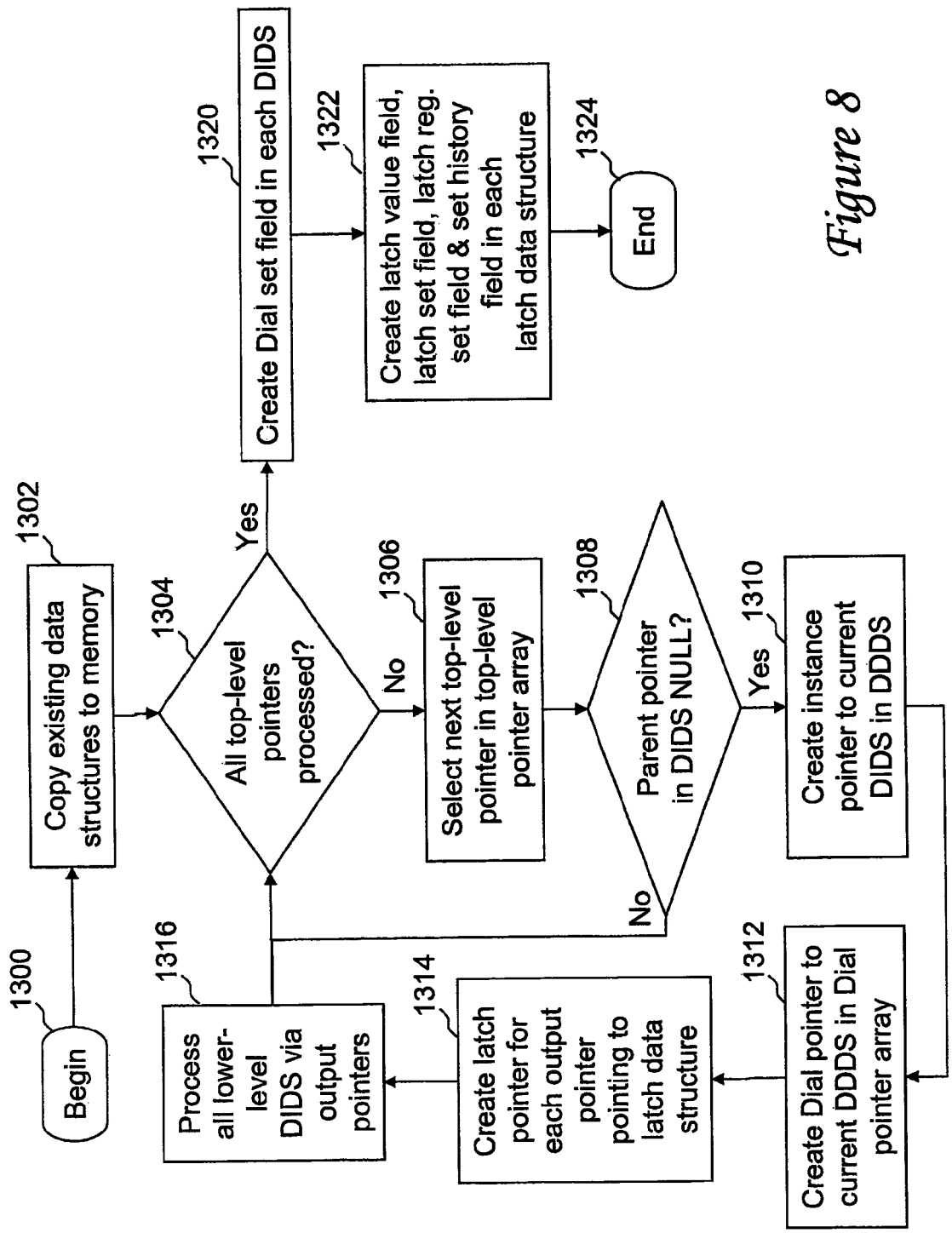
FIG. 8 is a high level logical flowchart of a illustrative method by which a configuration database is expanded within volatile memory of a data processing system in accordance with the present invention.

Referring now to FIG. 8, there is depicted a high level logical flowchart of a method by which configuration database 814 is expanded within volatile memory of a data processing system, such as system memory 18 of data processing system 8. Because FIG. 8 depicts logical steps rather than operational steps, it should be understood that many of the steps illustrated in FIG. 8 may be performed concurrently or in a different order than that shown.

As illustrated, the process begins at block 1300 and then proceeds to block 1302, which illustrates data processing system 6 copying the existing data structures within configuration database 814 from non-volatile storage (e.g., disk storage or flash memory) into volatile system memory 18. Next, at block 1304, a determination is made whether all top-level pointers 1250 within top-level pointer array 1206 of configuration database 814 have been processed. If so, the process passes to block 1320, which is discussed below. If not, the process proceeds to block 1306, which illustrates selection from top-level array 1206 of the next top-level pointer 1250 to be processed.

A determination is then made at block 1308 of whether or not parent pointer 1233 within the DIDS 1202 identified by the selected top-level pointer 1250 is a NULL pointer. If not, which indicates that the DIDS 1202 describes a top-level Dial belonging to a Dial group (as described in the above-referenced application), the process returns to block 1304, indicating that the top-level Dial and its associated lower-level Dials will be processed when the Dial group to which it belongs is processed.

In response to a determination at block 1308 that the parent pointer 1233 is a NULL pointer, data processing system 8 creates an instance pointer 1228 to the DIDS 1202 in the instance array 1226 of the DDDS 1200 to which definition pointer 1231 in definition field 1230 of DIDS 1202 points, as depicted at block 1310. Next, at block 1312, data processing system 8 creates a Dial pointer 1252 to the DDDS 1200 of the top-level Dial within Dial pointer array 1208, if the Dial pointer 1252 is not redundant. In addition, as shown at block 1314, data processing system 8 creates a latch pointer 1254 within latch pointer array 1210 pointing to each latch data structure 1204, if any, referenced by an output pointer 1238 of the DIDS 1202 of the top-level Dial. As shown at block 1316, each branch at each lower level of the Dial tree, if any, headed by the top-level Dial referenced by the selected top-level pointer 1250 is then processed similarly by performing the functions illustrated at block 1310-1316 until a latch data structure 1204 terminating that branch is found and processed. The process then returns to block 1304, representing the processing of each top-level pointer 1250 within top-level pointer array 1206.

In response to a determination at block 1304 that all top-level pointers 1250 have been processed, the process illustrated in FIG. 8 proceeds to block 1320. Block 1320 illustrates the creation of a instance set field 1239 in each DIDS 1320 in the configuration database. As noted above, instance set field 1239 is a Boolean-valued field that in initialized to FALSE and is updated to TRUE when the associated Dial instance is explicitly set. In addition, as depicted at block 1322, data processing system 8 creates a latch value field 1246, latch Register set field 1247, latch set field 1248, and set history field 1249 in each latch data structure 1204 to respectively indicate the current set value of the associated configuration latch, to indicate whether or not the configuration latch is set through the associated Register instance, to indicate whether or not the configuration latch is currently set by an explicit set command, and to indicate whether or not the configuration latch has ever been explicitly set. Although the creation of the five fields indicated at block 1320-1322 is illustrated separately from the processing depicted at blocks 1304-1316 for purposes of clarity, it will be appreciated that it is more efficient to create instance set field 1239 as each DIDS 1202 is processed and to create fields 1246, 1247, 1248 and 1249 as the latch data structures 1204 at the bottom of each Dial (or Register) tree are reached. The process of loading the configuration database into volatile memory thereafter terminates at block 1324.

Figure 9:
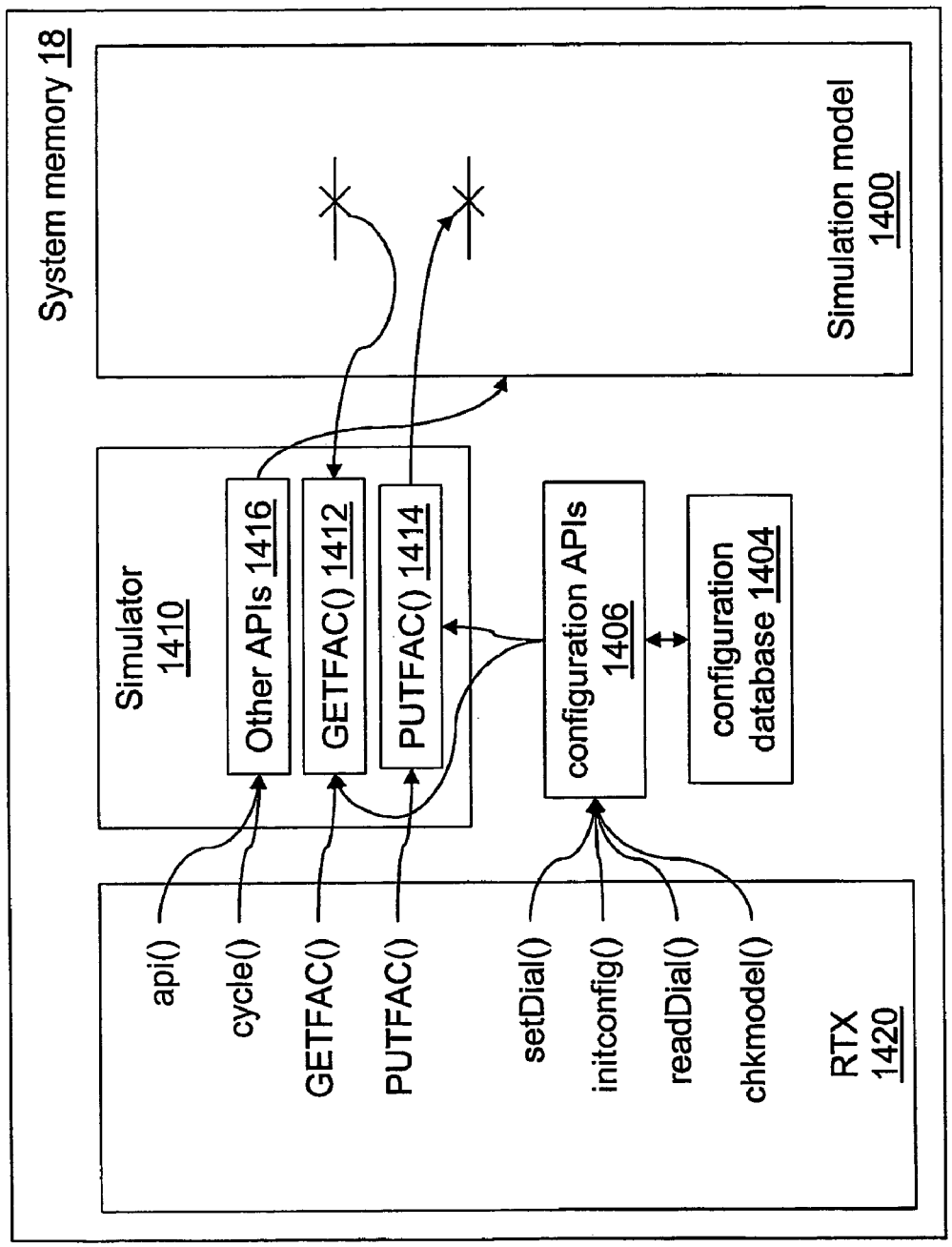
FIG. 9 is a block diagram depicting the contents of volatile system memory during a simulation run of a simulation model in accordance with the present invention.

With the configuration database loaded into volatile memory, a simulation model can be configured and utilized to simulate a digital design through the execution of simulation software. With reference to FIG. 9, there is illustrated a block diagram depicting the contents of system memory 18 (FIG. 1) during a simulation run of a simulation model. As shown, system memory 18 includes a simulation model 1400, which is a logical representation of the digital design to be simulated, as well as software including configuration APIs 1406, a simulator 1410 and an RTX (Run Time eXecutive) 1420.

Simulator 1410 loads simulation models, such as simulation model 1400, into system memory 18. During a simulation run, simulator 1410 resets, clocks and evaluates simulation model 1400 via various APIs 1416. In addition, simulator 1410 reads values in simulation model 1400 utilizing GET-FAC API 1412 and writes values to simulation model 1400 utilizing PUTFAC API 1414. Although simulator 1410 is implemented in FIG. 9 entirely in software, it will be appreciated in what follows that the simulator can alternatively be implemented at least partially in hardware.

Configuration APIs 1406 comprise software, typically written in a high level language such as C or C++, that support the configuration of simulation model 1400. These APIs, which are dynamically loaded by simulator 1410 as needed, include a first API that loads configuration model 814 from non-volatile storage and expands it in the manner described above with reference to FIG. 8 to provide a memory image of configuration database 1404. Configuration APIs 1406 further include additional APIs to access and manipulate configuration database 1404, as described in detail below.

RTX 1420 controls simulation of simulation models, such as simulation model 1400. For example, RTX 1420 loads test cases to apply to simulation model 1400. In addition, RTX 1420 delivers a set of API calls to configuration APIs 1406 and the APIs provided by simulator 1410 to initialize, configure, and simulate operation of simulation model 1400. During and after simulation, RTX 1420 also calls configuration APIs 1406 and the APIs provided by simulator 1410 to check for the correctness of simulation model 1400 by accessing various Dials, latches, counters and other entities within simulation model 1400.

As described in detail in the above-referenced application, RTX 1420 has two modes by which it accesses Dials instantiated within simulation model 1400: interactive mode and batch mode (A description of batch mode is omitted here.) In interactive mode, RTX 1420 calls a first set of APIs to read from or write to one or more instances of a particular Dial within configuration database 1404. The latch value(s) obtained by reference to configuration database 1404 take immediate effect in simulation model 1400. In batch mode, RTX 1420 calls a different second set of APIs to read or write instantiations of multiple Dials in configuration database 1404 and then make any changes to simulation model 1400 at the same time.

In either interactive or batch mode, RTX 1420 must employ some syntax in its API calls to specify which Dial instances within simulation model 1400 are to be accessed. Although a number of different syntaxes can be employed, including conventional regular expressions employing wildcarding, in an illustrative embodiment the syntax utilized to specify Dial instances in API calls is similar to the compact expression described in the above-referenced application. A key difference between compact expressions and the syntax utilized to specify Dial instances in the RTX API calls is that, in the illustrative embodiment, Dial and instances are specified in the RTX API calls by reference to the top-level design entity of simulation model 1400 rather than relative to the design entity in which the Dial is specified.

In the illustrative embodiment, each RTX API call targeting one or more Dial instances in simulation model 1400 specifies the Dial instances utilizing two parameters: an instance qualifier and a dialname qualifier. To refer to only a single Dial instantiation, the instance qualifier takes the form "a.b.c.d", which is the hierarchical instantiation identifier of the design entity in which the single Dial instantiation occurs. To refer to multiple Dial instances, the instance qualifier takes the form "a.b.c[X]", which identifies all instantiations of entity X within the scope of entity instance a.b.c. In the degenerate form, the instance qualifier may simply be "[X]", which identifies all instantiations of entity X anywhere within simulation model 1400.

The dialname qualifier preferably takes the form "Entity.dialname", where "Entity" is the design entity in which the Dial is instantiated and "dialname" is the name assigned to the Dial in its configuration specification statement. If bracketed syntax is employed to specify the instance qualifier, the "Entity" field can be dropped from the dialname qualifier since it will match the bracketed entity name.

Figure 10:
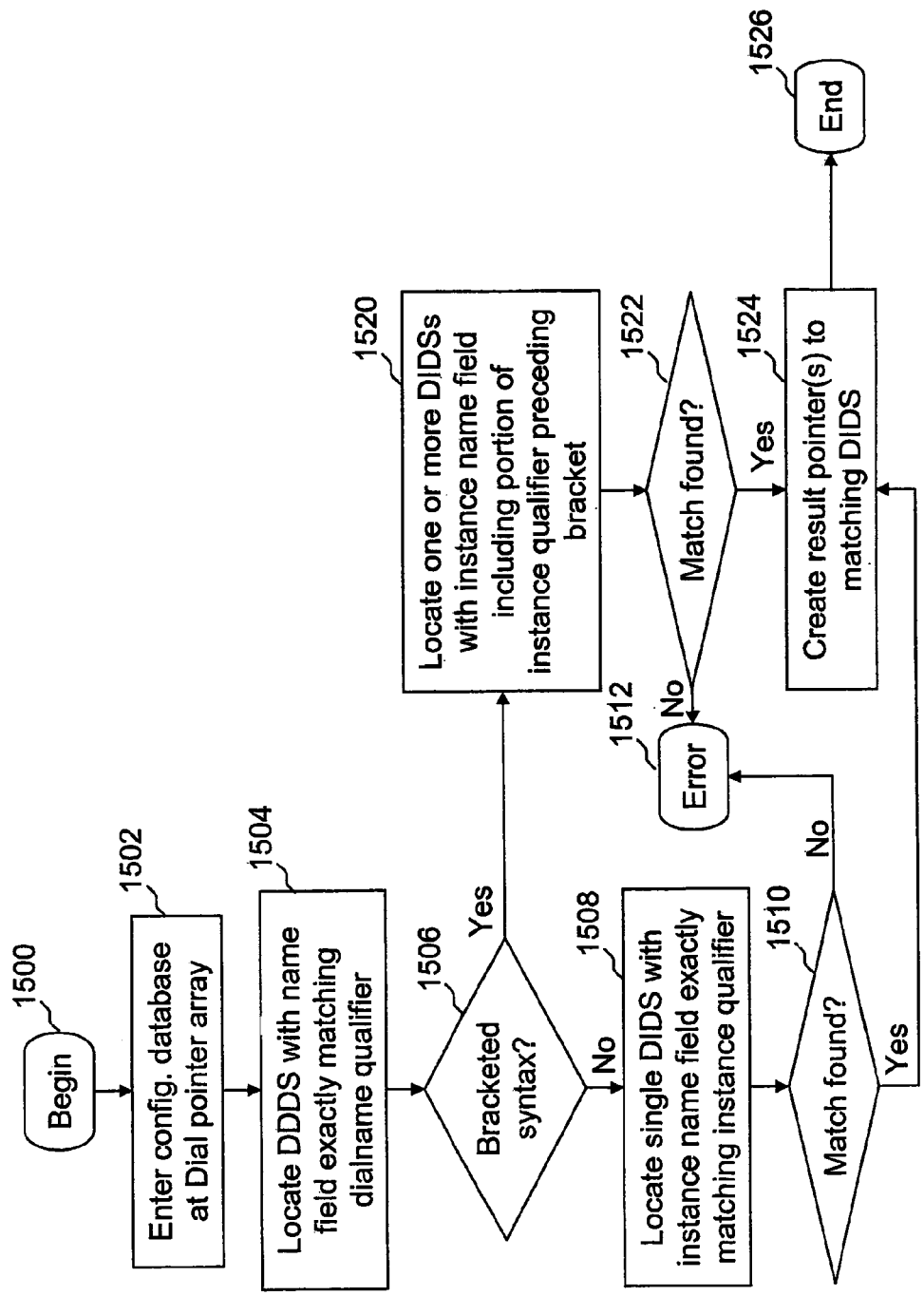
FIG. 10 is a high level logical flowchart of an exemplary method of locating one or more Dial instance data structure (DIDS) in a configuration database that are identified by a instance qualifier and dialname qualifier supplied in an API call.

Referring now to FIG. 10 there is depicted a high level logical flowchart of an exemplary process by which configuration APIs 1406 locate particular Dial instances in configuration database 1404 based upon an instance qualifier and dialname qualifier pair in accordance with the present invention. As shown, the process begins at block 1500 in response to receipt by a configuration API 1406 of an API call from RTX 1420 containing an instance qualifier and a dialname qualifier as discussed above. In response to the API call, the configuration API 1406 enters configuration database 1404 at Dial pointer array 1208, as depicted at block 1502, and utilizes Dial pointers 1252 to locate a DDDS 1200 having a name field 1222 that exactly matches the specified dialname qualifier, as illustrated at block 1504.

Next, at block 1506, the configuration API 1406 determines whether the instance qualifier employs bracketed syntax, as described above. If so, the process passes to block 1520, which is described below. However, if the instance qualifier does not employ bracketed syntax, the configuration API 1406 follows the instance pointers 1228 of the matching DDDS 1200 to locate the single DIDS 1202 having an instance name field 1234 that exactly matches the specified instance qualifier. As indicated at blocks 1510-1512, if no match is found, the process terminates with an error. However, if a matching DIDS 1202 is located, a temporary "result" pointer identifying the single matching DIDS 1202 is created at block 1524. The process thereafter terminates at block 1526.

Returning to block 1520, if bracketed syntax is employed, the configuration API 1406 utilizes instance pointers 1228 of the matching DDDS 1200 to locate one or more DIDSs 1202 of Dial instances within the scope specified by the prefix portion of the instance identifier preceding the bracketing. That is, a DIDS 1202 is said to "match" if the instance name field 1234 of the DIDS 1202 contains the prefix portion of the instance qualifier. Again, if no match is found, the process passes through block 1522 and terminates with an error at block 1512. However, if one or more DIDSs 1202 "match" the instance qualifier, temporary result pointers identifying the matching DIDSs 1202 are constructed at block 1524. The process shown in FIG. 10 thereafter terminates at block 1526.

Figure 11:
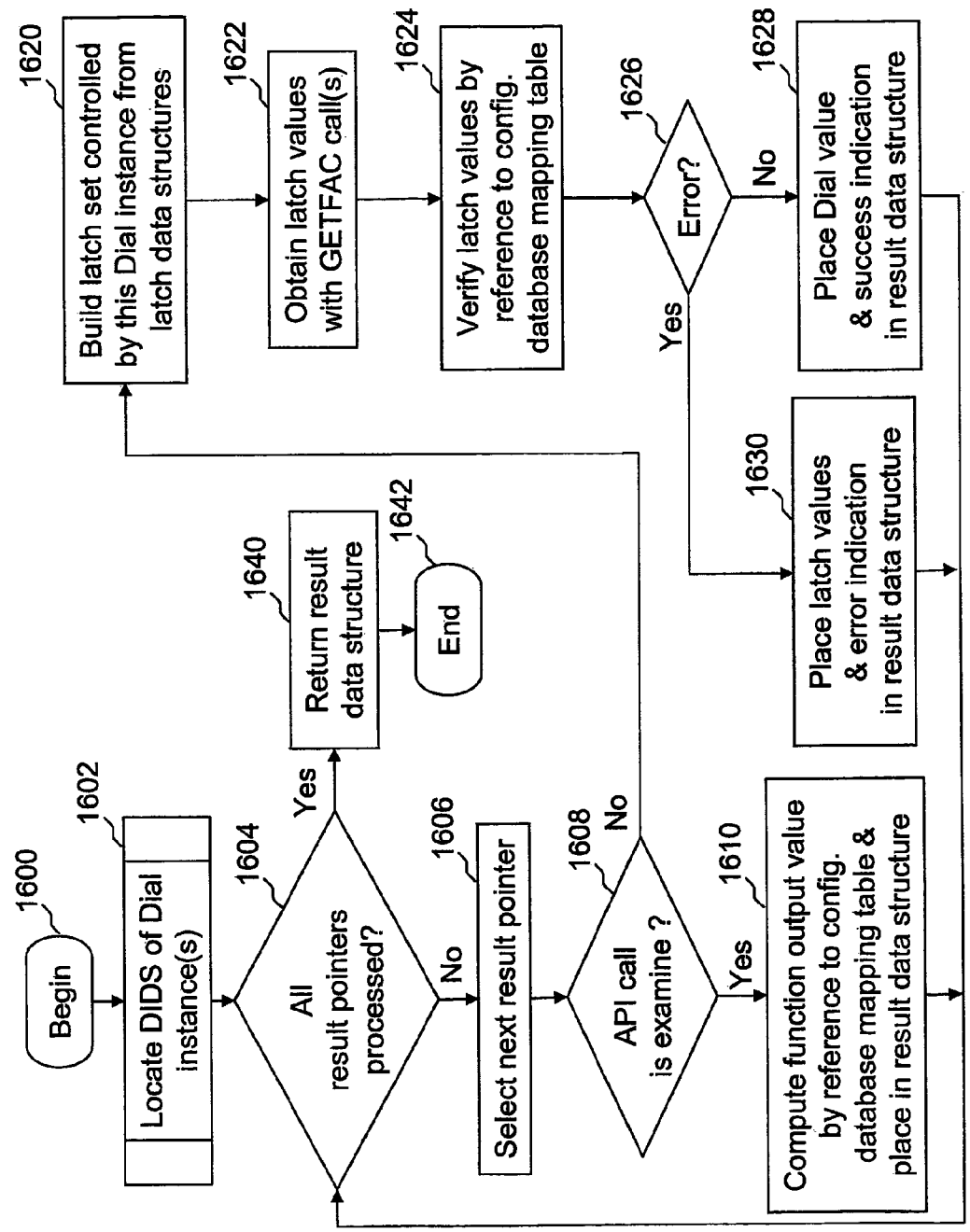
FIG. 11 is a high level logical flowchart of an illustrative method of reading a Dial instance in an interactive mode during simulation of a digital design in accordance with the present invention.
Figure 12:
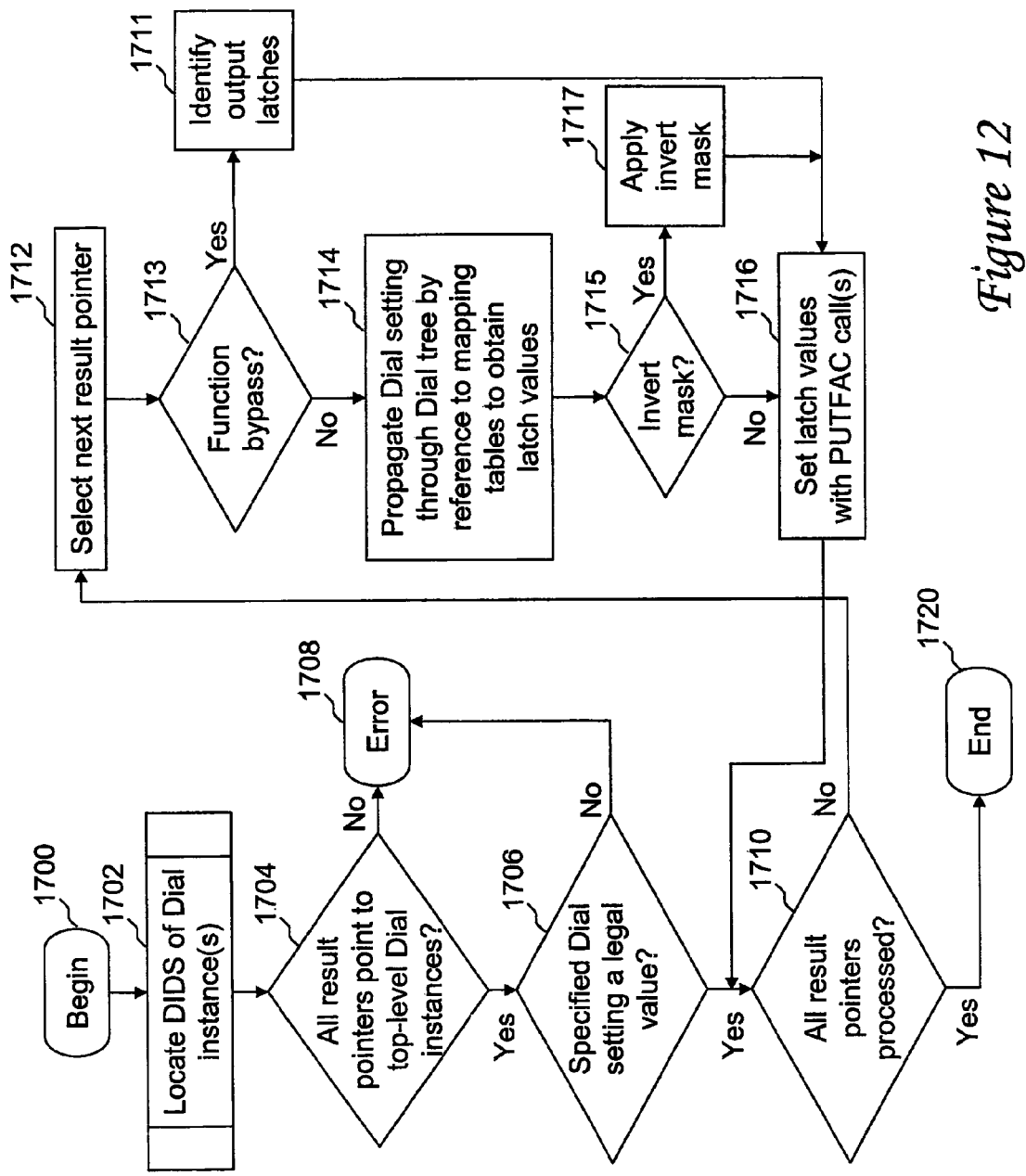
FIG. 12 is a high level logical flowchart of an illustrative method of setting a Dial instance in an interactive mode during simulation of a digital design in accordance with the present invention.

With reference now to FIGS. 11-12, there are illustrated high level logical flowcharts of exemplary processes respectively depicting the manner in which RTX 1420 reads and sets the values of Dial instances in interactive mode, in accordance with the present invention. In the described embodiments, two types of read operations and three types of set operations are supported for EDials utilizing EDial-specific parameters of read_Dial( ) and set_Dial( ) API calls.

In particular, for EDial read operations, an examine parameter may optionally be specified that causes the function of a specified EDial instance to be applied to an input data field contained within the read_Dial( ) API call, without any modification to or reporting of the values of the input or output latches of the specified EDial instance. Absent the examine parameter, an EDial read operation returns the values of the input and output latches of the specified EDial instance and an error indication of whether or not the values of the input and output latches are related by the function of the specified EDial instance.

For EDial set operations, a function bypass parameter may optionally be specified that causes the function of the specified EDial instance to be bypassed and for an output data field contained within the set_Dial( ) API call to be placed within the output latches of the specified EDial instance. Absent the function bypass parameter, the function specified for the EDial instance is applied to values within the input latches to obtain output values. Such output values may be further selectively modified before being placed within the output latches by an invert mask specified as a parameter of the set_Dial( ) API call. If no invert mask is specified as a parameter, the output values computed utilizing the function are placed within the output latches of the specified EDial instance.

Referring now to FIG. 11, the exemplary process of reading one or more Dial instances begins at block 1600 in response to receipt by a configuration API 1406 of a read_Dial( ) API call by RTX 1420. As indicated at block 1602, a configuration API 1406 responds to the read_Dial( ) API call by locating within configuration database 1404 one or more DIDSs 1202 of Dial instances responsive to the API call utilizing the process described above with reference to FIG. 10.

The process then enters a loop at block 1604 in which each of the temporary result pointers generated by the process of FIG. 10 is processed. If all of the result pointers returned by the process of FIG. 10 have been processed, the process passes to block 1640, which is described below. If not, the process proceeds from block 1606 to block 1608, which illustrates the configuration API 1406 selecting a next result pointer to be processed. Next, at block 1608, the configuration API 1406 determines by reference to the read_Dial( ) API call whether or not an examine parameter relevant only to EDials is specified. If so, the process illustrated in FIG. 11 proceeds to block 1610, which depicts applying the function specified within the mapping table of the DIDS 1202 identified at block 1602 to an input data field specified as a parameter of the read_Dial( ) API call. The resulting output bits generated by the function are placed within a result data structure, without reference to the values of the input or output latches of the EDial instance. Thereafter, the process returns to block 1604, which has been described.

Referring again to block 1608, in response to a determination that the read_Dial( ) API does not contain an examine parameter, the process proceeds to block 1620. Block 1620 depicts configuration API 1406 utilizing input/output pointers 1238 of the DIDS 1202 (and those of any lower-level DIDS 1202 in the Dial tree) to build a data set containing the latch names from the latch name fields 1244 of latch data structures 1204 corresponding to all configuration latches ultimately controlled by the Dial instance specified in the API call. For an EDial, the data set further also includes the latch names from the latch name fields 1244 of latch data structures 1204 corresponding to the input latches of the EDial. Next, as depicted at block 1622, the configuration API 1406 makes one or more API calls to GETFAC( ) API 1412 of simulator 1410 to obtain from simulation model 1400 the latch values of all of the latches listed in the data set constructed at block 1620.

Configuration API 1406 then verifies the latch values obtained from simulation model 1400 by reference to configuration database 1404, as shown at block 1624. In order to verify the latch values of LDials and IDials, configuration API 1406 utilizes mapping tables 1224 to propagate the latch values up the Dial tree from the corresponding latch data structures through intermediate DIDSs 1202, if any, until an input value for the requested Dial instance is determined. If at any point in this verification process, a Dial instance's output value generated by the verification process does not correspond to one of the legal values enumerated in its mapping table 1224, an error is detected at block 1626. For EDials, configuration API 1406 verifies latch values by applying the values of the input latches to the function specified within the mapping table 1224 to obtain output values for comparison to the contents of the output latches of the EDial. If the output values of the function do not match the contents of the output latches of the EDial, an error is detected at block 1626.

In response to detection of an error at block 1626, the latch values read from simulation model 1400 and an error indication are placed in a result data structure, as illustrated at block 1630. If the error is detected in an EDial, the input latch values are also placed in the result data structure. If no error is detected at block 1626, the Dial input value(s) obtained by the verification process and a success indication are placed in the result data structure, as shown at block 1628. If the Dial is an EDial, the output latch values are also placed within the result data structure.

As indicated by the process returning to block 1604, the above-described process is repeated for each temporary result pointer returned by the process of FIG. 10. Once all result pointers have been processed, the process passes from block 1604 to blocks 1640-1642, which illustrate the configuration API 1406 returning the result data structure to RTX 1420 and then terminating.

RTX 1420 reads Dial instances in interactive mode utilizing the method of FIG. 11, for example, to initialize checkers that monitor portions of simulation model 1400 during simulation runs. The Dial settings of interest include not only those of top-level Dial instances, but also those of lower-level Dial instances affiliated with the portions of the simulation model 1400 monitored by the checkers.

With reference now to FIG. 12, there is illustrated a high level logical flowchart of an exemplary process by which an RTX sets a Dial instance in an interactive mode in accordance with the present invention. The process begins at block 1700 in response to receipt by a configuration API 1406 of a set_Dial( ) API call from RTX 1420. In response to the set_Dial( ) API call, the configuration API 1406 first locates and generates temporary result pointers pointing to the DIDS 1202 of the Dial instance(s) specified in the set_Dial( ) API call utilizing the technique described above with reference to FIG. 10, as illustrated at block 1702. Next, the configuration API 1406 determines at block 1704 whether or not all of the temporary result pointers point to DIDSs 1202 of top-level Dial instances. This determination can be made, for example, by examining the parent pointer 1233 of each such DIDS 1202 (and that of any higher level DIDS 1202 linked by a parent pointer 1233) and the type fields 1220 of the associated DDDSs 1200. The DIDS 1202 of a top-level Dial instance will have either a NULL parent pointer 1233 or a non-NULL parent pointer 1233 pointing to another DIDS 1202 that the type field 1220 of the associated DDDS 1200 indicates represents a Dial group. If any of the DIDSs 1202 referenced by the result pointers does not correspond to a top-level Dial instance, the process terminates at block 1708 with an error condition.

In response to a determination at block 1704 that all of the DIDSs 1202 referenced by the result pointers correspond to top-level Dial instances, a further determination is made at block 1706 whether or not the specified input value to which the Dial instance(s) are to be set is legal. For EDials and IDials, any input bit pattern of the proper size is legal; for CDials and LDials, a legal value must be one of the values specified in the mapping table 1224 of the associated DDDS 1200. If a determination is made at block 1706 that the specified input value is not legal, the process terminates with an error at block 1708. However, in response to a determination at block 1706 that the specified value to which the Dial instance(s) are to be set is one of the legal values, the process enters a loop including blocks 1710-1716 in which each result pointer is processed to set a respective Dial instance.

At block 1710, configuration API 1406 determines whether or not all result pointers have been processed. If so, the process terminates at block 1720. If, however, additional result pointers remain to be processed, the next result pointer to be processed is selected at block 1712. Next, at block 1713, configuration API 1406 determines whether or not the set_Dial( ) API call included a function bypass parameter for use with EDials. If so, the process proceeds to block 1711, which depicts configuration API 1406 identifying the latch data structures 1204 of the output latches of the EDial by reference to the output pointers 1238 in the input/output pointer array 1236 of the DIDS 1202 referenced by the current result pointer. The process then passes directly to block 1716, which represents configuration API 1406 calling PUTFAC( ) API 1414 to set the configuration latches in simulation model 1400 to an output value specified as a parameter the set_Dial API call utilizing the latch names specified within the latch name fields 1244 of the corresponding latch data structures 1204. In this manner, the function specified within the mapping table 1224 of the DDDS 1200 associated with the current result pointer can be bypassed to permit the output latches of EDials to be set to user-specified values.

Returning to block 1713, if the set_Dial( ) API call does not include a function bypass parameter, the process proceeds to block 1714, which illustrates configuration API 1406 propagating the Dial setting (which for IDials, LDials and CDials is specified in the set_Dial( ) API call and which for EDials is specified by the EDial input latches) down the Dial tree headed by the top-level Dial instance associated with the DIDS 1202 referenced by the current result pointer. In order to propagate the desired Dial setting, mapping table 1224 in the DDDS 1200 associated with the DIDS 1202 referenced by the current result pointer is first referenced, if necessary, (i.e., for CDials, LDials and EDials) to determine the output values for each of output pointers 1238 in the input/output pointer array 1236. These output values are propagated down the Dial tree as the input values of the next lower-level Dial instances, if any, corresponding to the DIDSs 1202 referenced by output pointers 1238. This propagation continues until a latch value is determined for each configuration latch terminating the Dial tree (which are represented in configuration database 1404 by latch data structures 1204).

Configuration API 1406 then determines at block 1715 whether or not an invert mask has been specified for an EDial within the set_Dial( ) API call. If not, the process proceeds to block 1716, which illustrates that as each latch value for a configuration latch is determined, the configuration API 1406 makes a call to PUTFAC( ) API 1414 to set the configuration latch in simulation model 1400 to the determined value utilizing the latch name specified within the latch name field 1244 of the corresponding latch data structure 1204. If, however, an invert mask has been specified for an EDial as a parameter of the set_Dial( ) API call, configuration API 1406 performs an exclusive OR (XOR) of the set of latch values determined at block 1714 with the invert mask specified within the set_Dial( ) API call before setting the latch values within simulation model 1400 at block 1716. In this manner, parity, ECC or other errors can be selectively induced to facilitate the verification of error detection and correction facilities within simulation model 1400.

Following block 1716, the process returns to block 1710, which represents the processing of the top-level Dial corresponding to the next result pointer. After all result pointers are processed, the process terminates at block 1720.

Referring again to FIG. 9, configuration APIs 1406 preferably further include a find_unset_latch( ) API that, following a batch mode setting of Dial instances in configuration database 1404, audits all of the latch data structures 1204 in configuration database 1204 by reference to latch pointer array 1210 in order to detect configuration latches that have not been configured by an explicit or default setting (i.e., those having set history field 1249 set to FALSE). For each such unset configuration latch, the find_unset_latch( ) API preferably returns the fully qualified instance name of the configuration latch from latch name field 1244 in the corresponding latch data structure 1204 and the fully qualified instantiation identifier of the top-level Dial instance that controls the unset latch. The find_unset_latch( ) API thus provides an automated mechanism for a user to verify that all Dial and latch instances requiring an explicit or default setting are properly configured for a simulation run.

Configuration APIs 1406 preferably further include a check_model( ) API that, when called, utilizes top-level pointer array 1206 to verify by reference to the appropriate mapping tables 1224 that each top-level CDial and LDial instance in simulation model 1400 is set to one of its legal values. Any top-level LDial or CDial set to an illegal value is returned by the check_model( ) API.

The Dial primitives introduced by the present invention can be employed not only to configure a simulation model of a digital design as described above, but also to configure hardware realizations of the digital design for laboratory testing and customer use. In accordance with an important aspect of the present invention, hardware realizations of the digital design are configured by reference to a hardware configuration database, which like configuration databases 814 and 1404 discussed above, is derived from configuration specification statements coded by the designers. In this manner, continuity in configuration methodology exists from design, through simulation and laboratory testing, to commercial deployment of a digital design. Because an exemplary hardware environment, an exemplary method of transforming a configuration database 814, 1404 for a simulation environment into a hardware configuration database suitable for use in a laboratory or deployed environment, and an exemplary method of configuring a hardware realization of a digital design are described in detail in the above-referenced application, their description is omitted in the present application.

While the invention has been particularly shown as described with reference to a preferred embodiment, it will be understood by those skilled in the art that various changes in form and detail may be made therein without departing from the spirit and scope of the invention. For example, it will be appreciated that the concepts disclosed herein may be extended or modified to apply to other types of configuration entities than those disclosed herein.

Furthermore, although aspects of the present invention have been described with respect to a computer system executing software that directs the functions of the present invention, it should be understood that present invention may alternatively be implemented as a program product for use with a data processing system. Programs defining the functions of the present invention can be delivered to a data processing system via a variety of signal-bearing media, which include, without limitation, non-rewritable storage media (e.g., CD-ROM), rewritable storage media (e.g., a floppy diskette or hard disk drive), and communication media, such as digital and analog networks. It should be understood, therefore, that such signal-bearing media, when carrying or encoding computer readable instructions that direct the functions of the present invention, represent alternative embodiments of the present invention.

What is claimed is:

1. A method of data processing to configure a digital system including one or more design entities containing a functional portion of the digital system, said method comprising:

instantiating within a configuration database separate from the digital system one or more configuration entities including an Error checking Dial (EDial) having a plurality of input latches within the digital design and a plurality of output latches within the digital design, said EDial referencing an associated function specifying at least one mathematical or logical transformation of bit values of said input latches to obtain bit values of said output latches; and accessing an instance of said EDial in said configuration database to access values of said output latches in said digital design.

2. The method of claim 1, and further comprising:

in at least one hardware definition language (HDL) file among one or more files, defining said digital system; and with one or more statements in said one or more files, specifying said one or more configuration entities including said EDial and associating said EDial with said plurality of input latches and plurality of output latches in said digital design.

3. The method of claim 2, and further comprising compiling said one or more statements to generate said configuration database.

4. The method of claim 1, wherein said function comprises one of a set including a parity function and an error correction code (ECC) function.

5. The method of claim 1, wherein said digital system comprises a hardware digital system.

6. The method of claim 1, wherein said accessing comprises reading values of said output latches, wherein said reading includes:

receiving a read request specifying said instance of said EDial;

accessing said instance of said EDial in said configuration database to identify said plurality of output latches;

accessing said plurality of output latches in said digital design to obtain said values of said plurality of output latches; and returning said values of said plurality of output latches.

7. The method of claim 1, and further comprising:
in response to receipt of an examine parameter in an access request, applying said function to an input field provided with said access request and returning an output of said function in an output field.

8. The method of claim 1, wherein said accessing comprises setting values of said output latches, wherein said setting includes:
receiving a set request specifying said instance of said EDial;
accessing said instance of said EDial in said configuration database to identify said plurality of input latches, said plurality of output latches and said function;
accessing said plurality of input latches in said digital design to obtain said values of said plurality of input latches;
applying said function to said values of said plurality of input latches to obtain function output values; and
setting said plurality of output latches in said digital design based upon said function output values.

9. The method of claim 8, and further comprising applying a mask specified in said set request to said function output values and setting said plurality of output latches with resulting values.

10. A data processing system for configuring a digital design, said data processing system comprising:
processing resources; and
data storage including program code, including:
means for instantiating within a configuration database separate from the digital design one or more configuration entities including an Error checking Dial (EDial) having a plurality of input latches within the digital design and a plurality of output latches within the digital design, said EDial referencing an associated function specifying at least one mathematical or logical transformation of bit values of said input latches to obtain bit values of said output latches; and
means for accessing an instance of said EDial in said configuration database to access values of said output latches in said digital design.

11. The data processing system of claim 10, said program code further comprising:
means for, in at least one hardware definition language (HDL) file among one or more files, defining said digital system; and
means for, with one or more statements in said one or more files, specifying said one or more configuration entities including said EDial and associating said EDial with said plurality of input latches and plurality of output latches in said digital design.

12. The data processing system of claim 11, and further comprising means for compiling said one or more statements to generate said configuration database.

13. The data processing system of claim 10, wherein said function comprises one of a set including a parity function and an error correction code (ECC) function.

14. The data processing system of claim 10, and further comprising said digital system, wherein said digital system comprises a hardware digital system.

15. The data processing system of claim 10, wherein said means for accessing comprises means for reading values of said output latches, wherein said means for reading values of said output latches includes:
means for receiving a read request specifying said instance of said EDial;
means for accessing said instance of said EDial in said configuration database to identify said plurality of output latches;
means for accessing said plurality of output latches in said digital design to obtain said values of said plurality of output latches; and
means for returning said values of said plurality of output latches.

16. The data processing system of claim 10, and further comprising:
means, responsive to receipt of an examine parameter in an access request, for applying said function to an input field provided with said access request and returning an output of said function in an output field.

17. The data processing system of claim 10, wherein said means for accessing comprises means for setting values of said output latches, wherein said means for setting includes:
means for receiving a set request specifying said instance of said EDial;
means for accessing said instance of said EDial in said configuration database to identify said plurality of input latches, said plurality of output latches and said function;
means for accessing said plurality of input latches in said digital design to obtain said values of said plurality of input latches;
means for applying said function to said values of said plurality of input latches to obtain function output values; and
means for setting said plurality of output latches in said digital design based upon said function output values.

18. The data processing system of claim 17, and further comprising means for applying a mask specified in said set request to said function output values and setting said plurality of output latches with resulting values.

19. A program product comprising:
a computer readable medium; and
program code within said computer readable medium for causing a data processing system to perform a method for configuring a digital system including one or more design entities containing a functional portion of the digital system, said method including:
instantiating within a configuration database separate from the digital design one or more configuration entities including an Error checking Dial (EDial) having a plurality of input latches within the digital design and a plurality of output latches within the digital design, said EDial referencing an associated function specifying at least one mathematical or logical transformation of bit values of said input latches to obtain bit values of said output latches; and
accessing an instance of said EDial in said configuration database to access values of said output latches in said digital design.

20. The program product of claim 19, said method further comprising:
in at least one hardware definition language (HDL) file among one or more files, defining said digital system; and
with one or more statements in said one or more files, specifying said one or more configuration entities including said EDial and associating said EDial with said plurality of input latches and plurality of output latches in said digital design.

* * * * *